United States Patent
Shen

(10) Patent No.: US 11,804,394 B2
(45) Date of Patent: Oct. 31, 2023

(54) METHODS AND SYSTEMS FOR IMPROVING TRANSFER EFFICIENCY OF AN AUTOMATED MATERIAL HANDLING SYSTEM

(71) Applicant: Taiwan Semiconductor Manufacturing Company Limited, Hsinchu (TW)

(72) Inventor: Yen-Fu Shen, Jhubei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 124 days.

(21) Appl. No.: 17/460,390

(22) Filed: Aug. 30, 2021

(65) Prior Publication Data

US 2023/0065660 A1    Mar. 2, 2023

(51) Int. Cl.
*H01L 21/677* (2006.01)

(52) U.S. Cl.
CPC .. *H01L 21/67751* (2013.01); *H01L 21/67712* (2013.01); *H01L 21/67733* (2013.01); *H01L 21/67769* (2013.01); *H01L 21/67736* (2013.01)

(58) Field of Classification Search
CPC .......... H01L 21/6773; H01L 21/67733; H01L 21/67736; H01L 21/67763; H01L 21/67769; Y10S 414/14
USPC ....................................................... 414/940
See application file for complete search history.

(56) References Cited

U.S. PATENT DOCUMENTS

| 7,604,449 | B1* | 10/2009 | Kaveh | H01L 21/67775 414/411 |
| 8,909,364 | B2* | 12/2014 | Tsukinoki | H01L 21/67778 700/121 |
| 2002/0182040 | A1* | 12/2002 | Kimura | H01L 21/67772 414/940 |
| 2003/0156928 | A1* | 8/2003 | Sackett | H01L 21/67775 414/217 |
| 2010/0068013 | A1* | 3/2010 | Mizokawa | H01L 21/67763 414/222.01 |

* cited by examiner

*Primary Examiner* — Saul Rodriguez
*Assistant Examiner* — Brendan P Tighe
(74) *Attorney, Agent, or Firm* — The Marbury Law Group, PLLC

(57) ABSTRACT

Methods and systems for improving the efficiency of an automated material handling system (AMHS) include providing an apparatus operatively coupled to a load port of a processing apparatus, where the apparatus is configured to remove a first work-in-process from the load port and to move the first work-in-process along a first direction to displace the first work-in-progress from the load port while a second work-in-progress is transferred to the load port from an AMHS vehicle along a second direction that is perpendicular to the first direction, and transferring the first work-in-progress to an AMHS vehicle along the second direction. The methods and systems may be used for loading and unloading wafer storage containers, such as front opening unified pods (FOUPs), in a semiconductor fabrication facility.

20 Claims, 32 Drawing Sheets

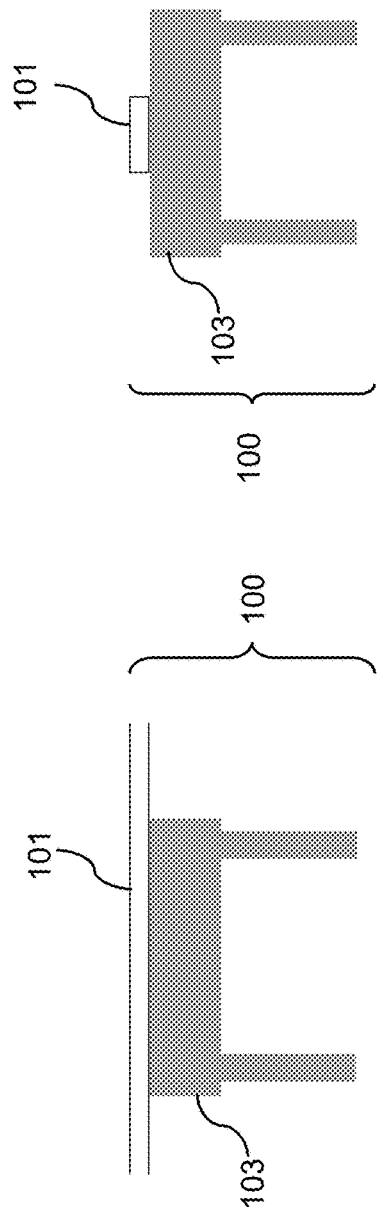
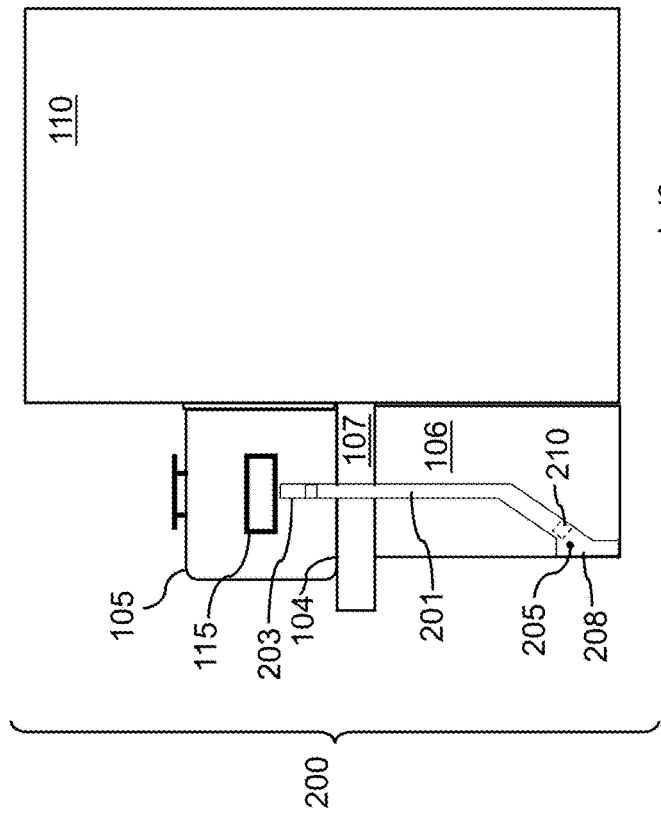
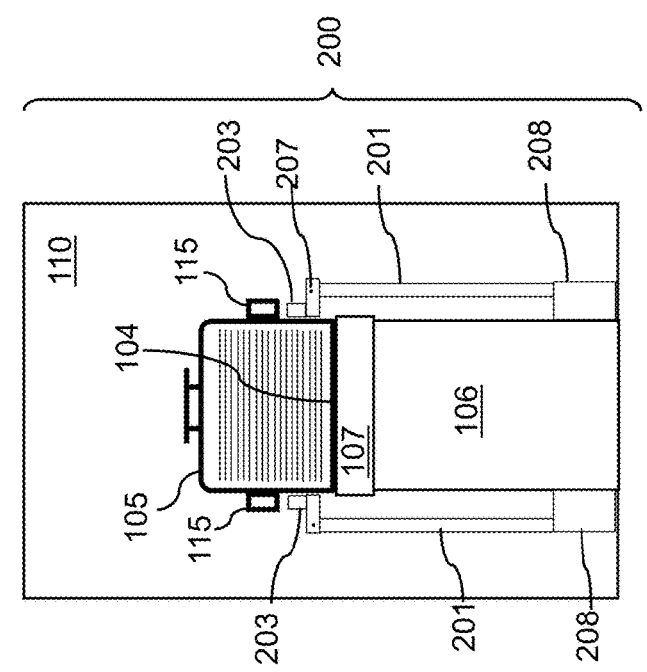
FIG. 3A
FIG. 3B

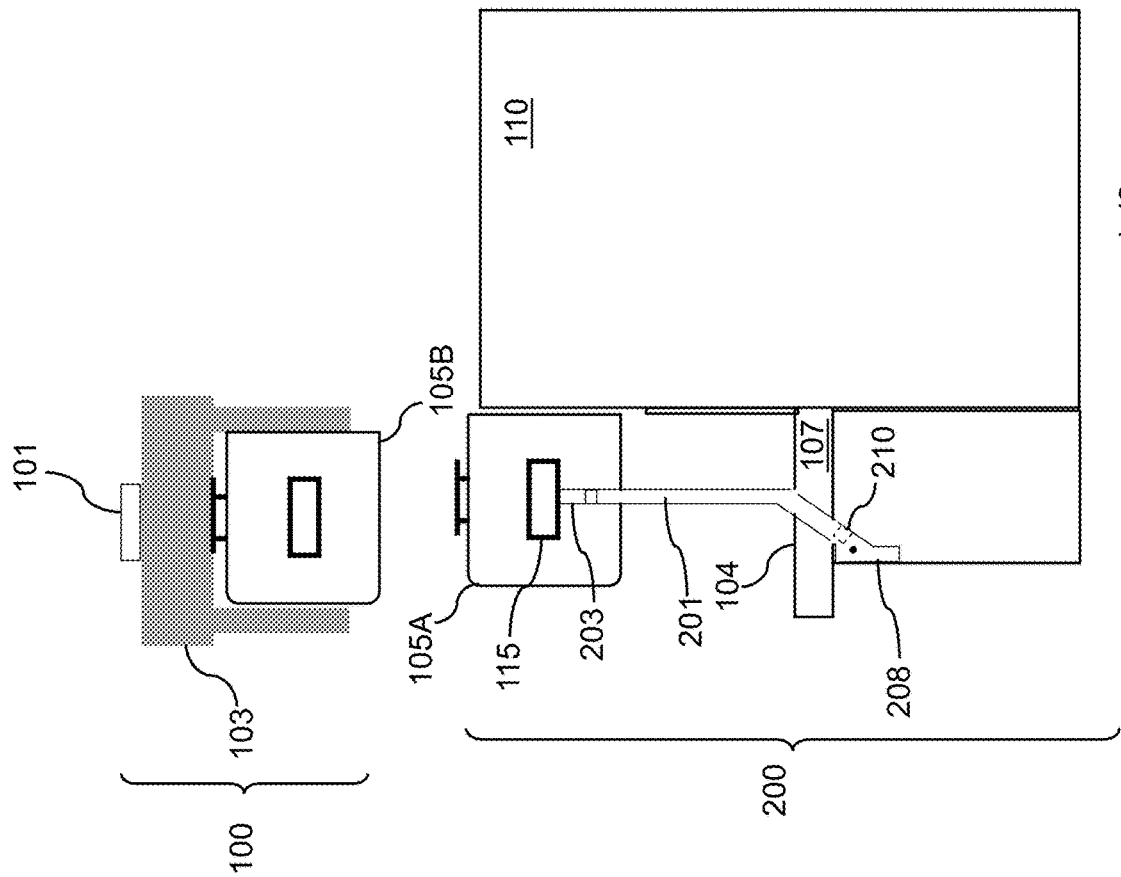
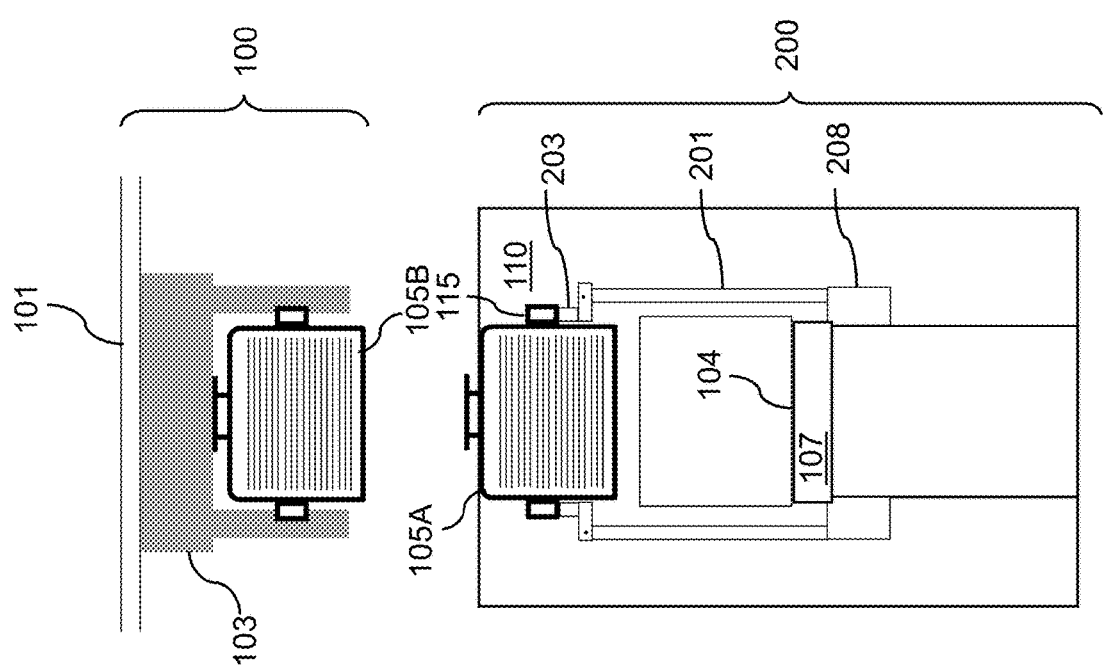
FIG. 4A
FIG. 4B

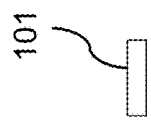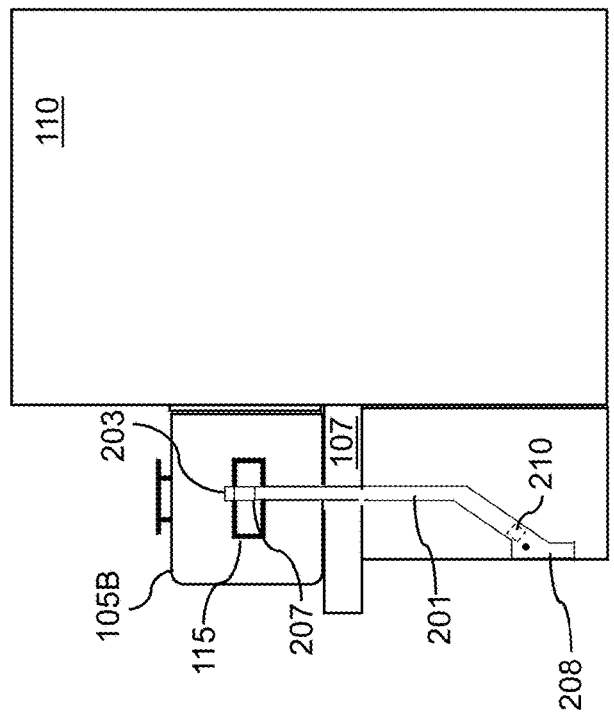
FIG. 9B
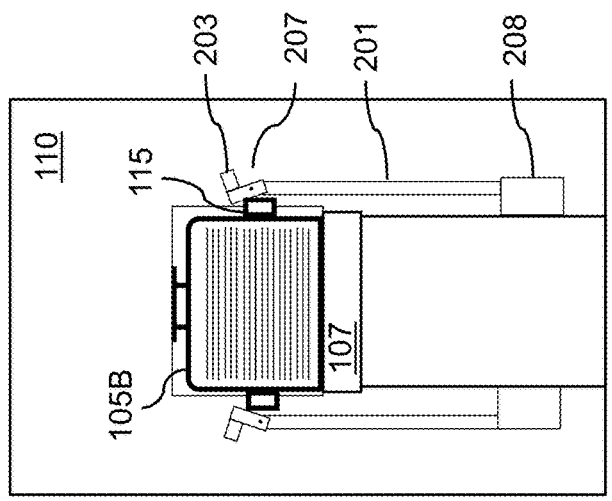
FIG. 9A

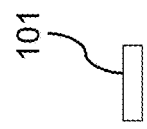
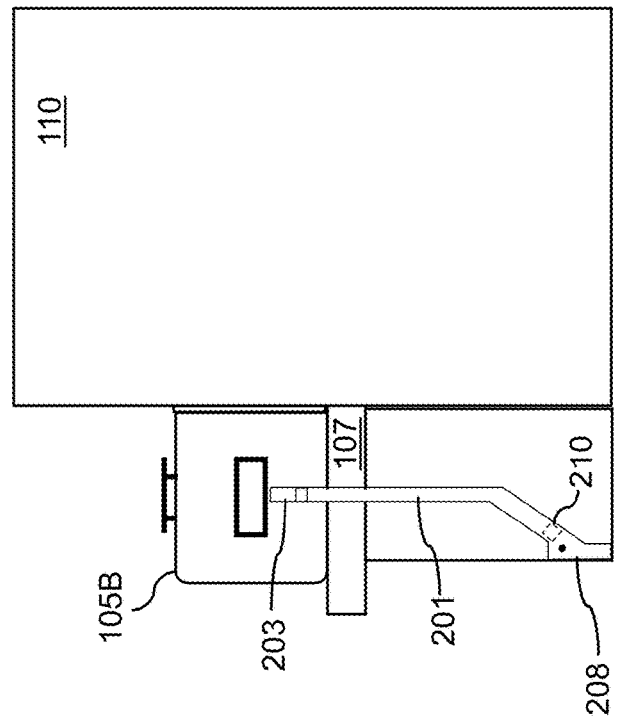
FIG. 10B
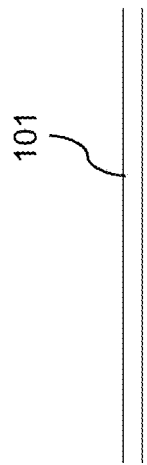
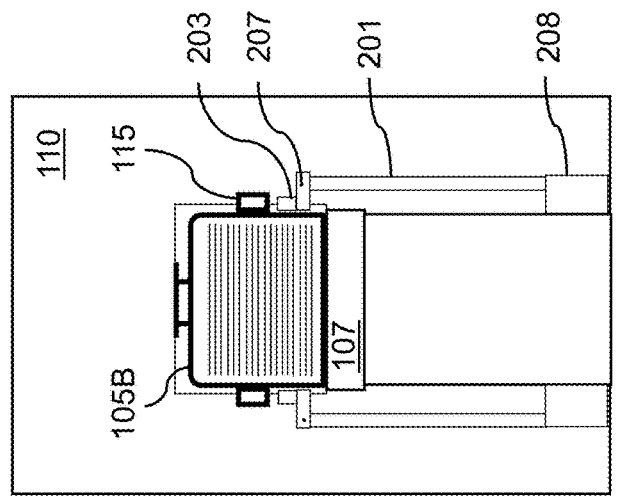
FIG. 10A

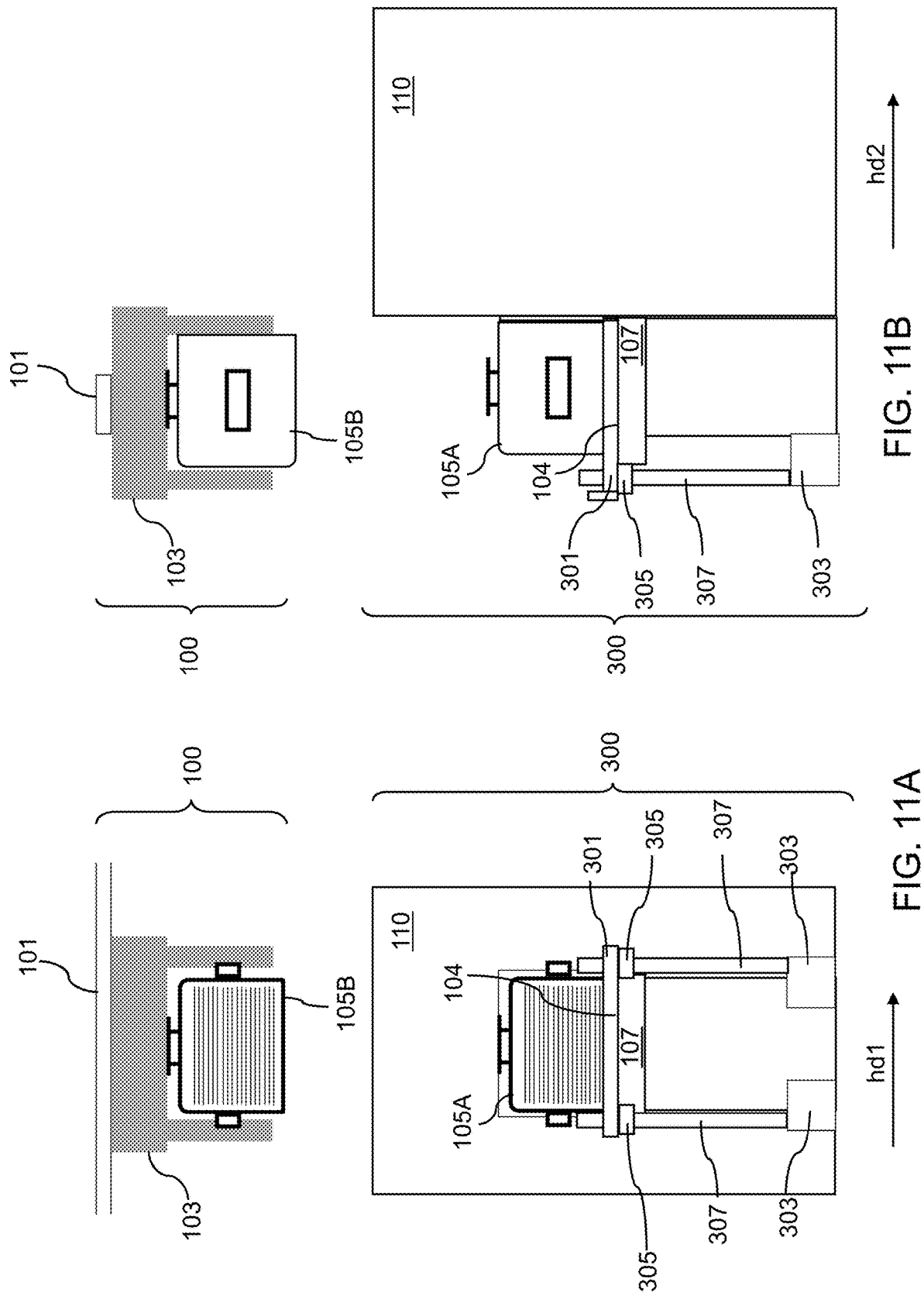

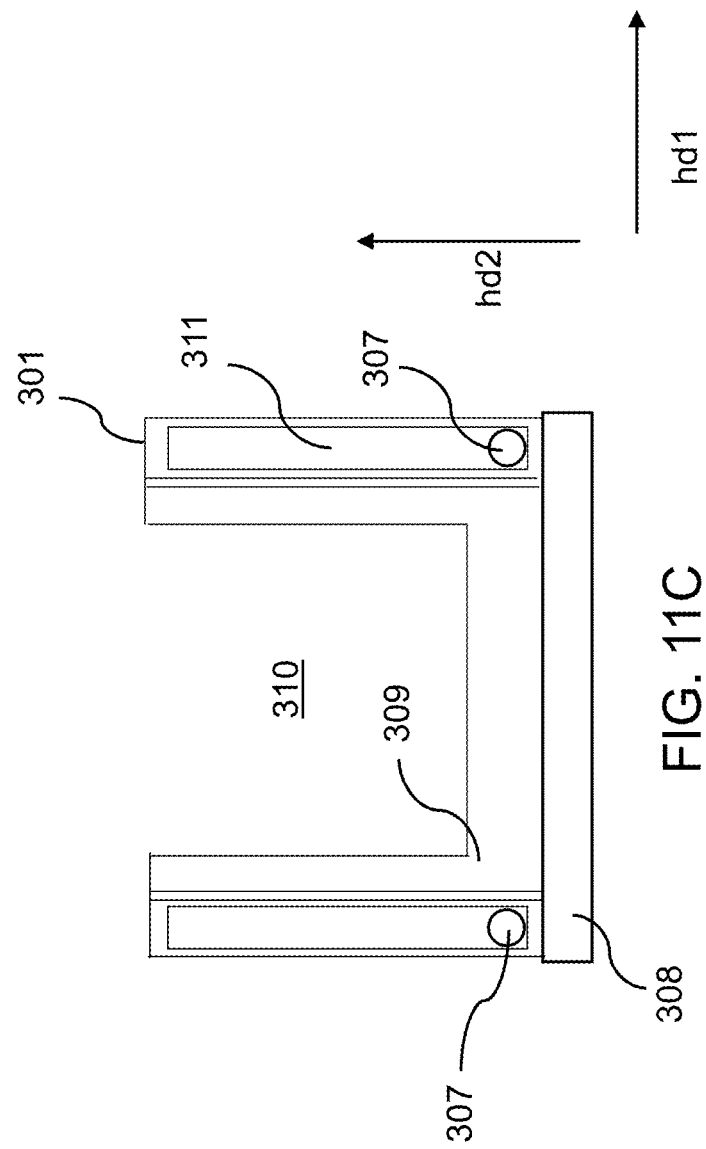

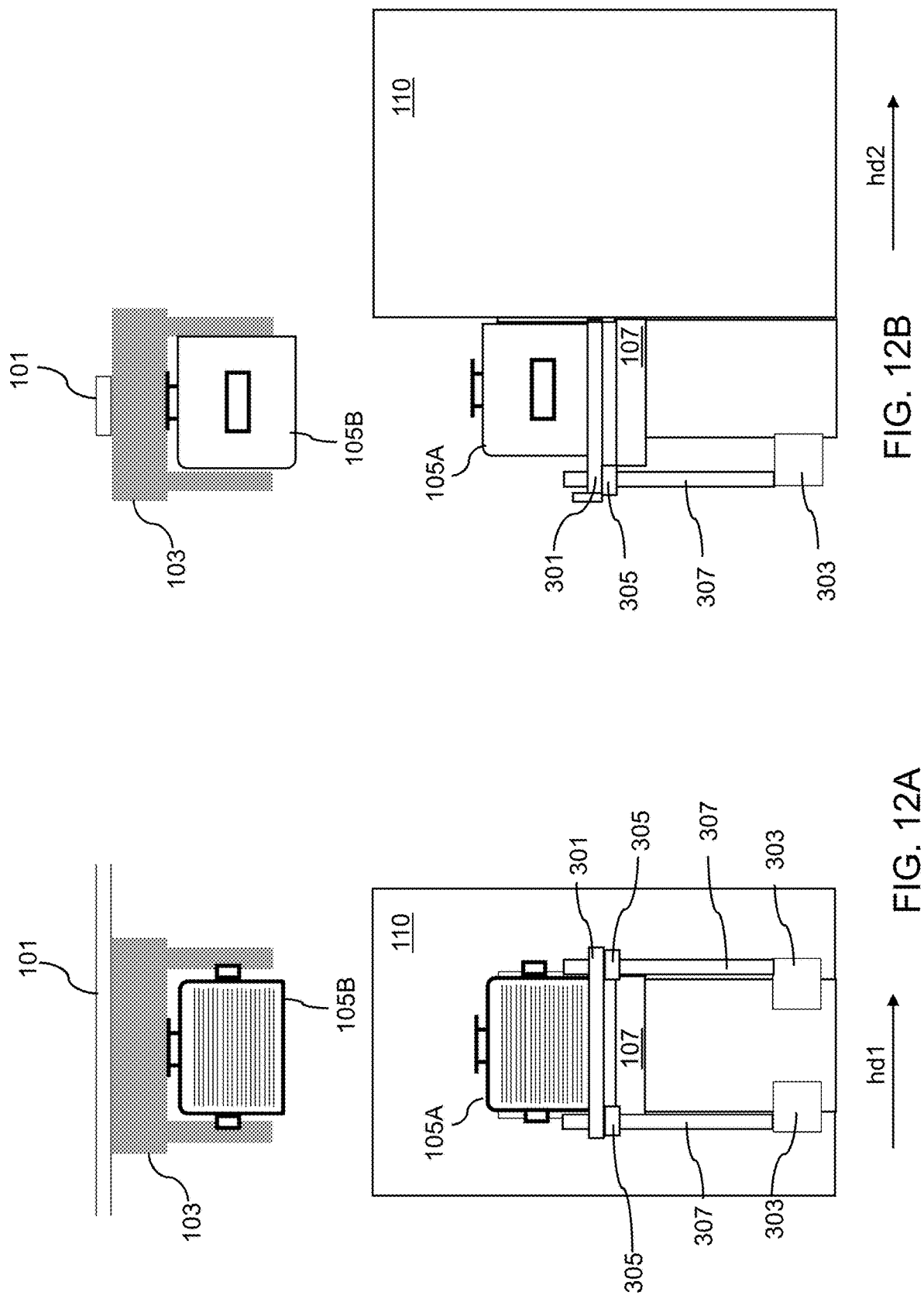

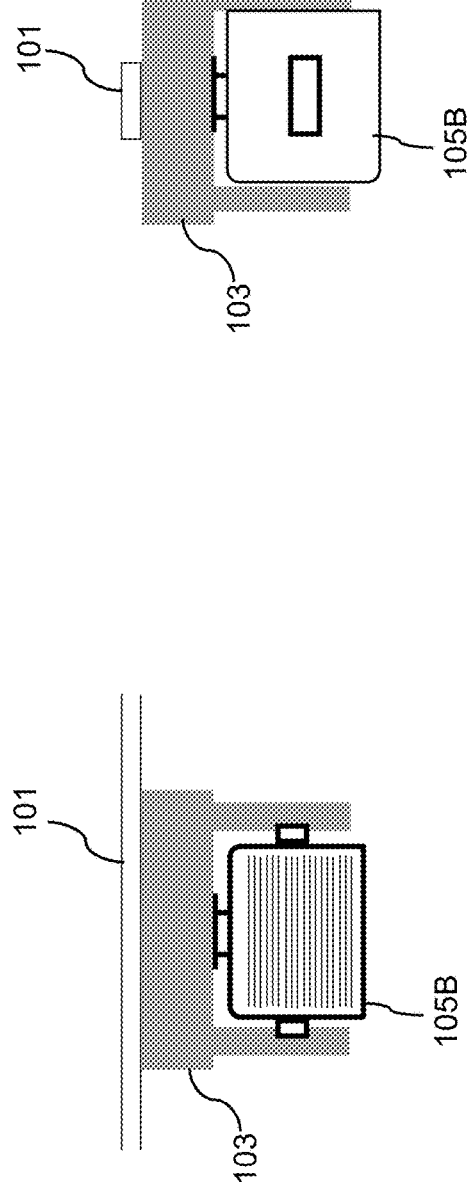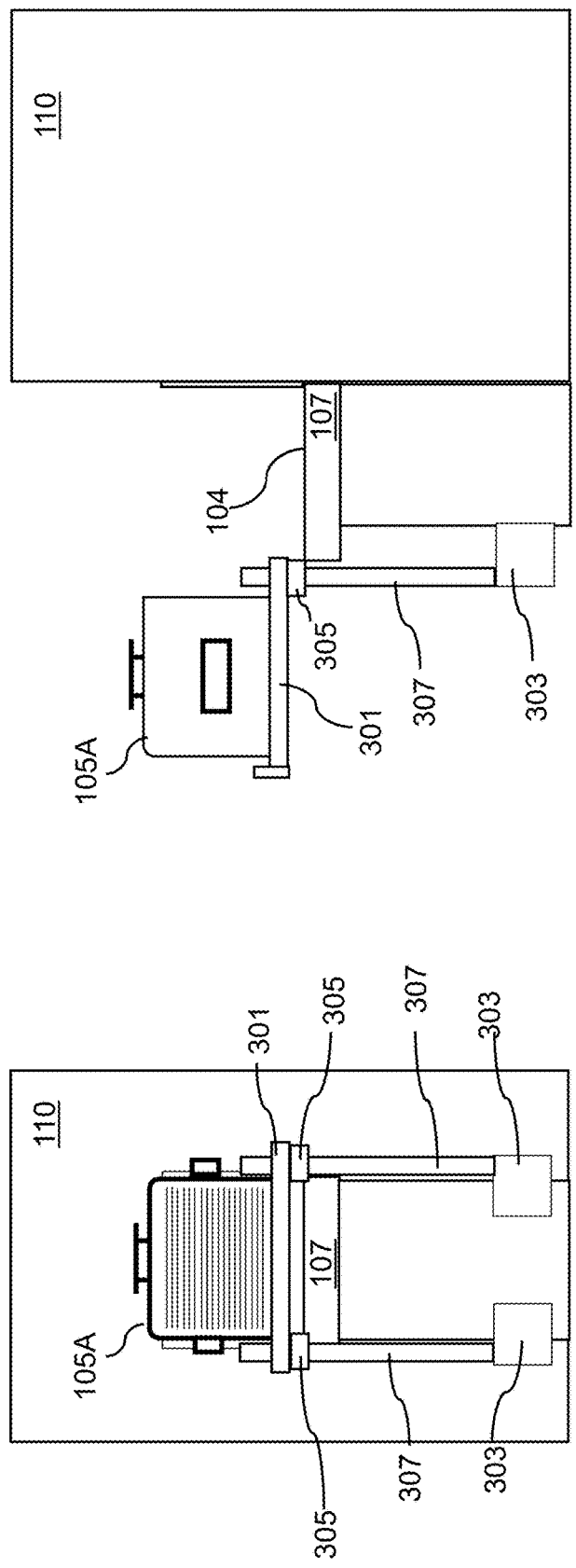

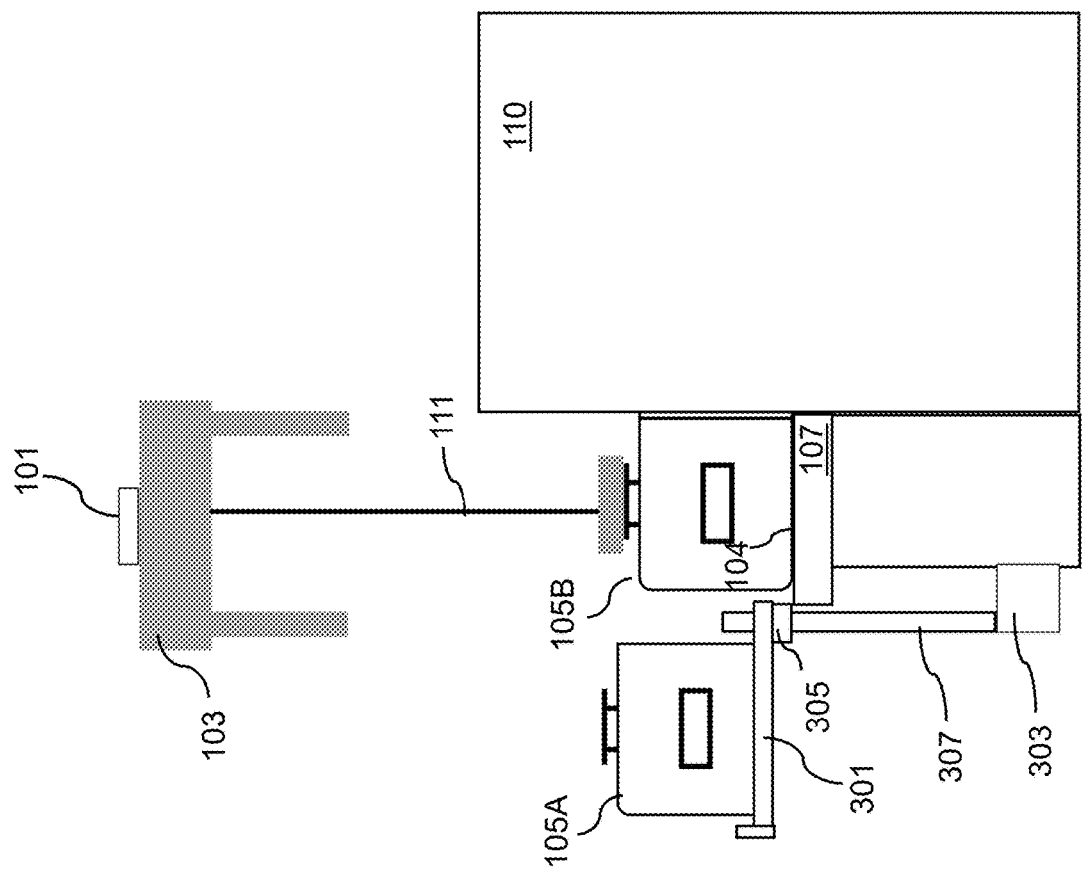
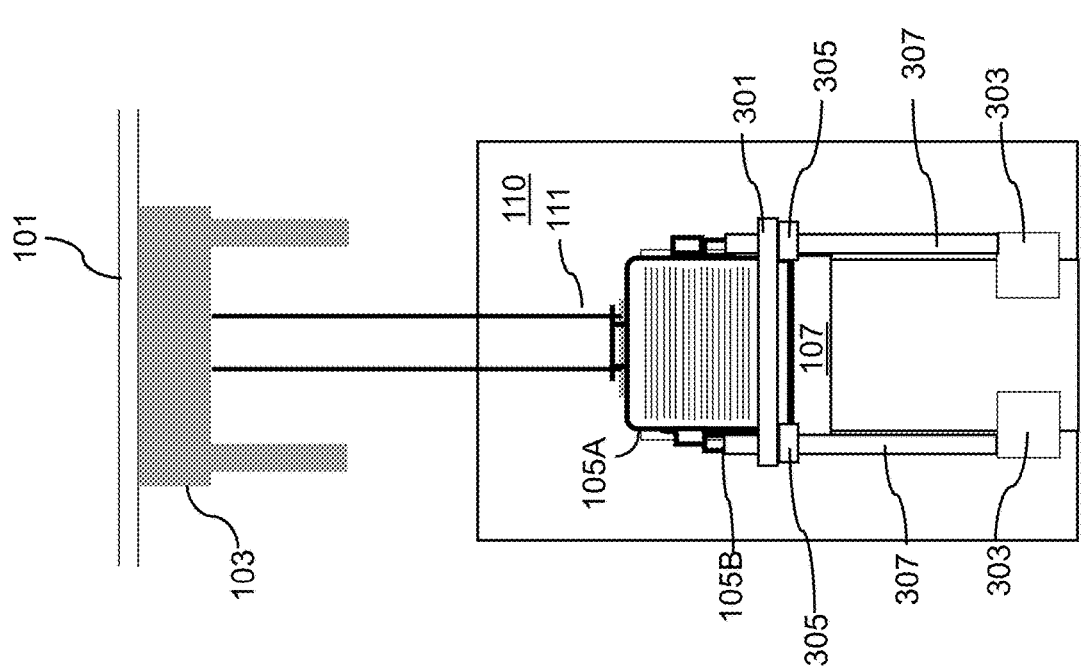

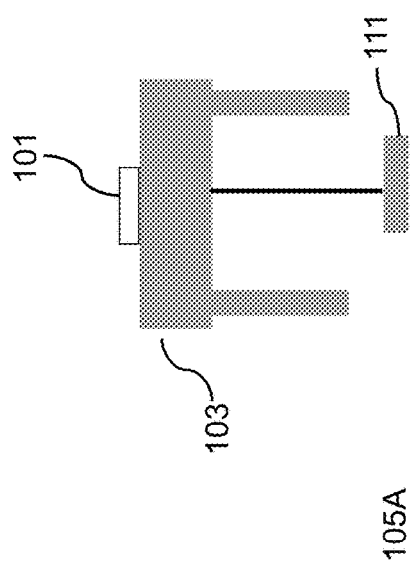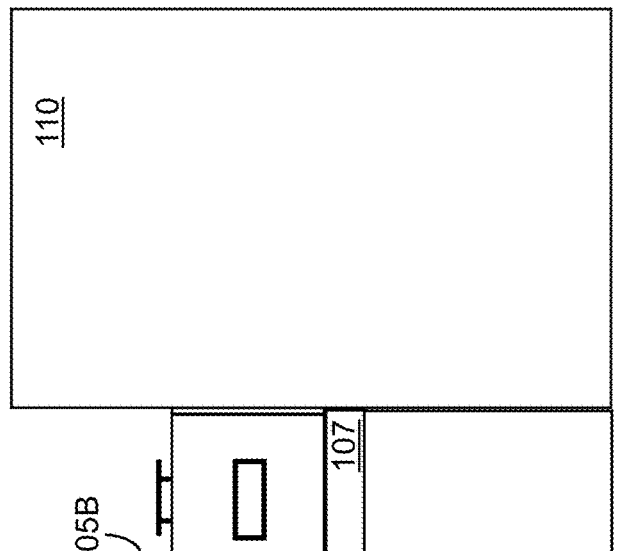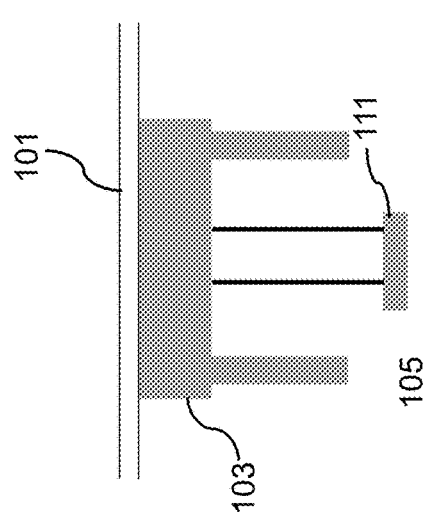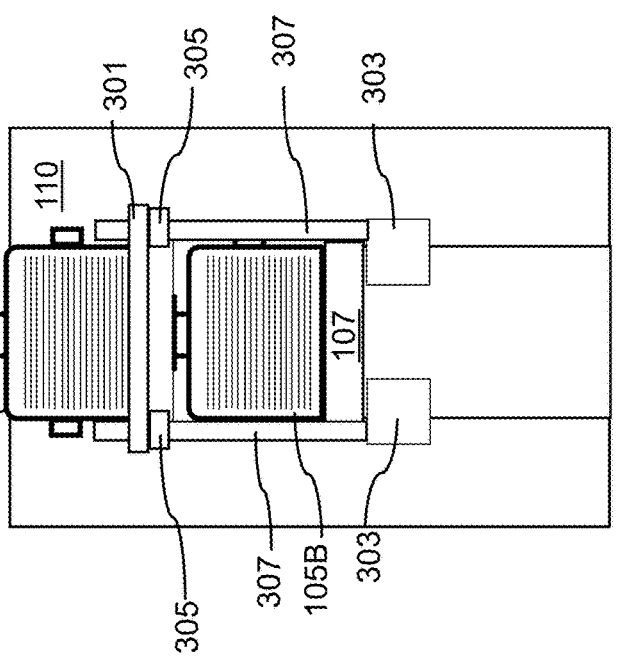
FIG. 15A
FIG. 15B

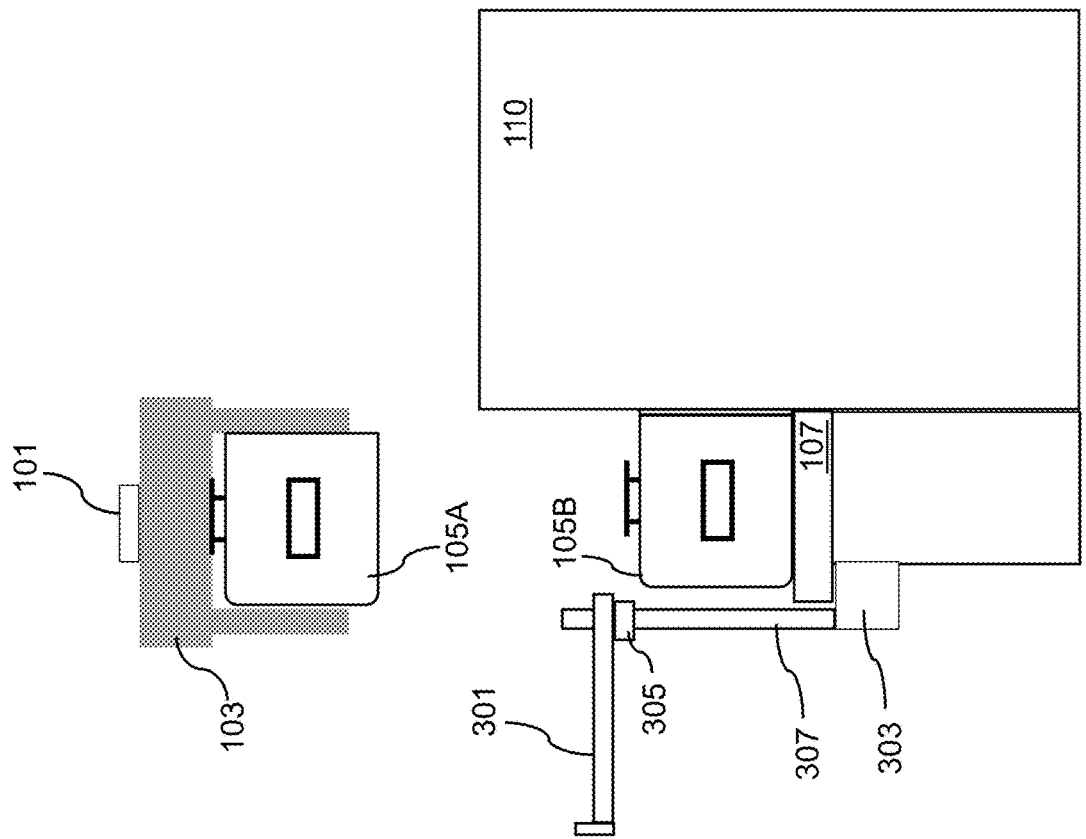
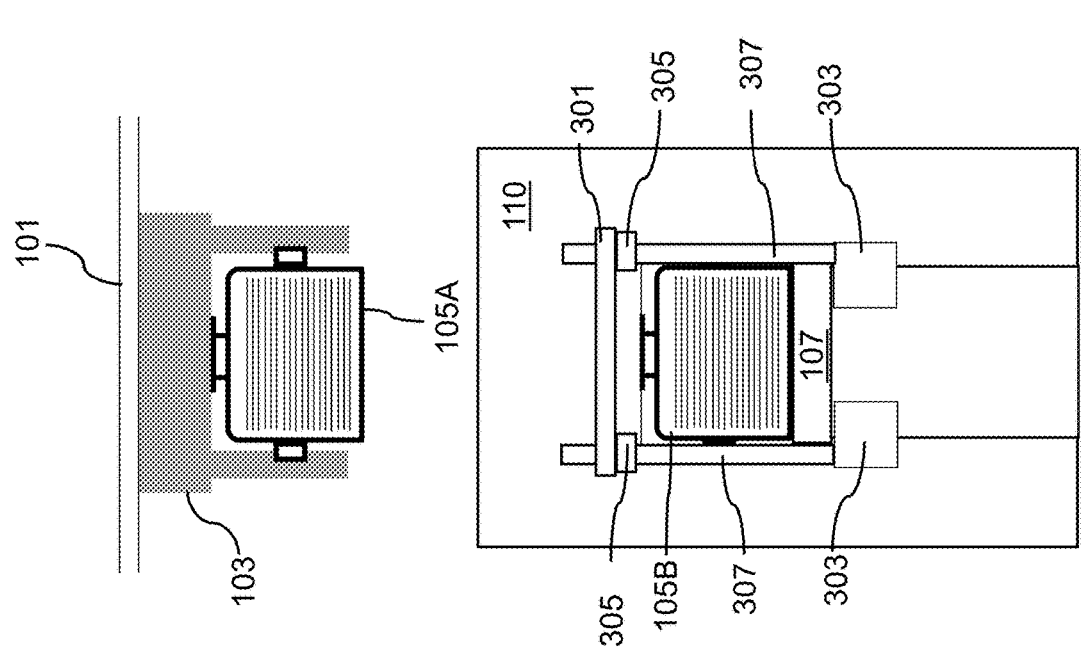

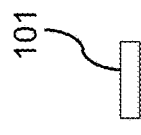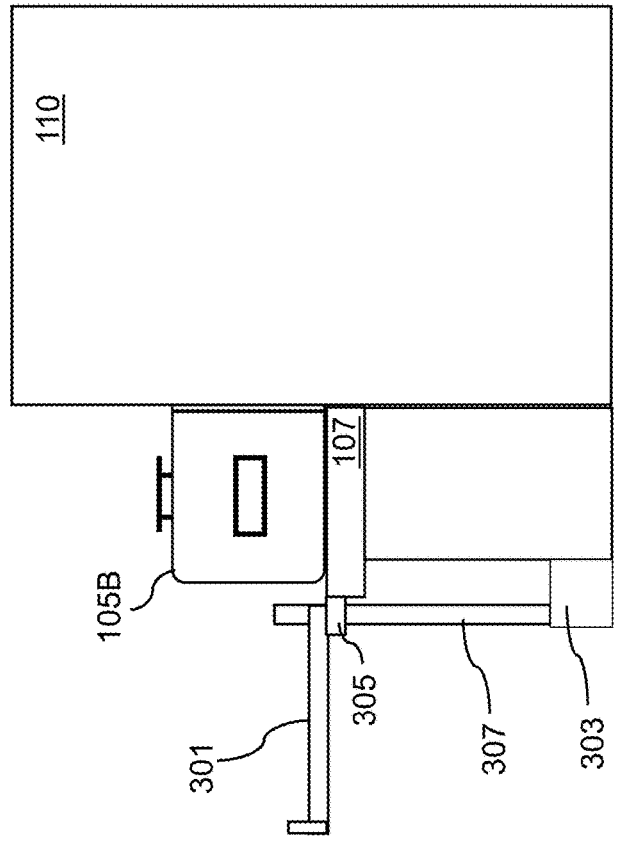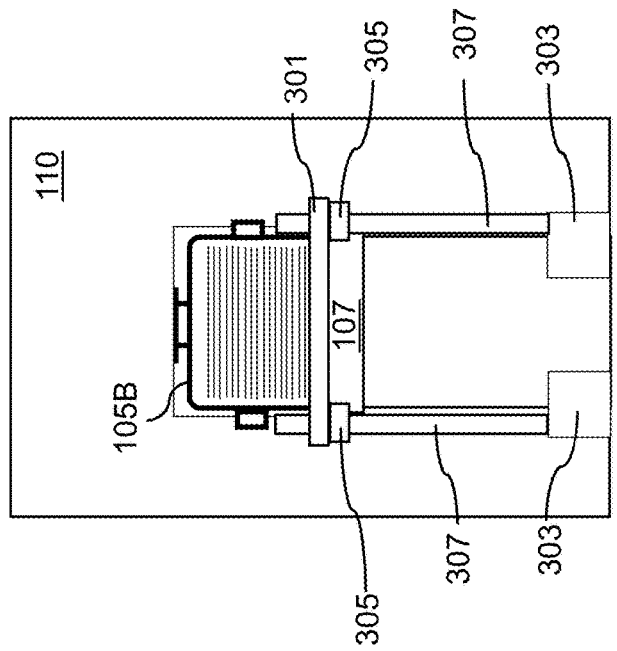

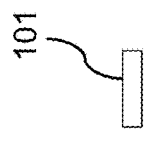
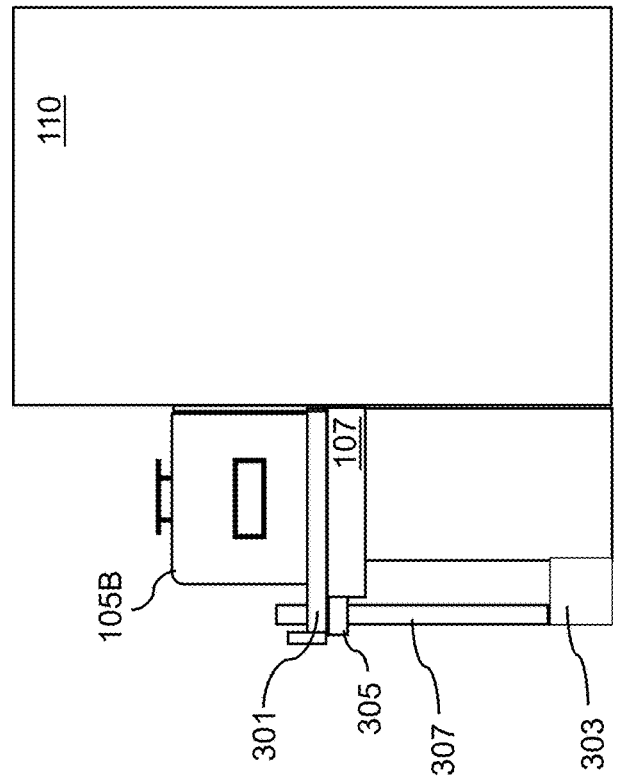
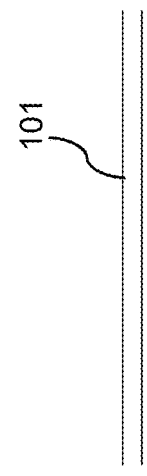
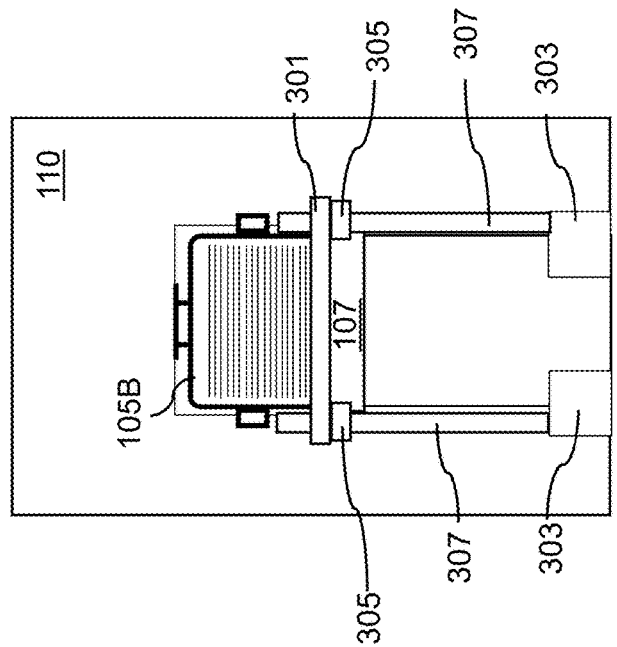

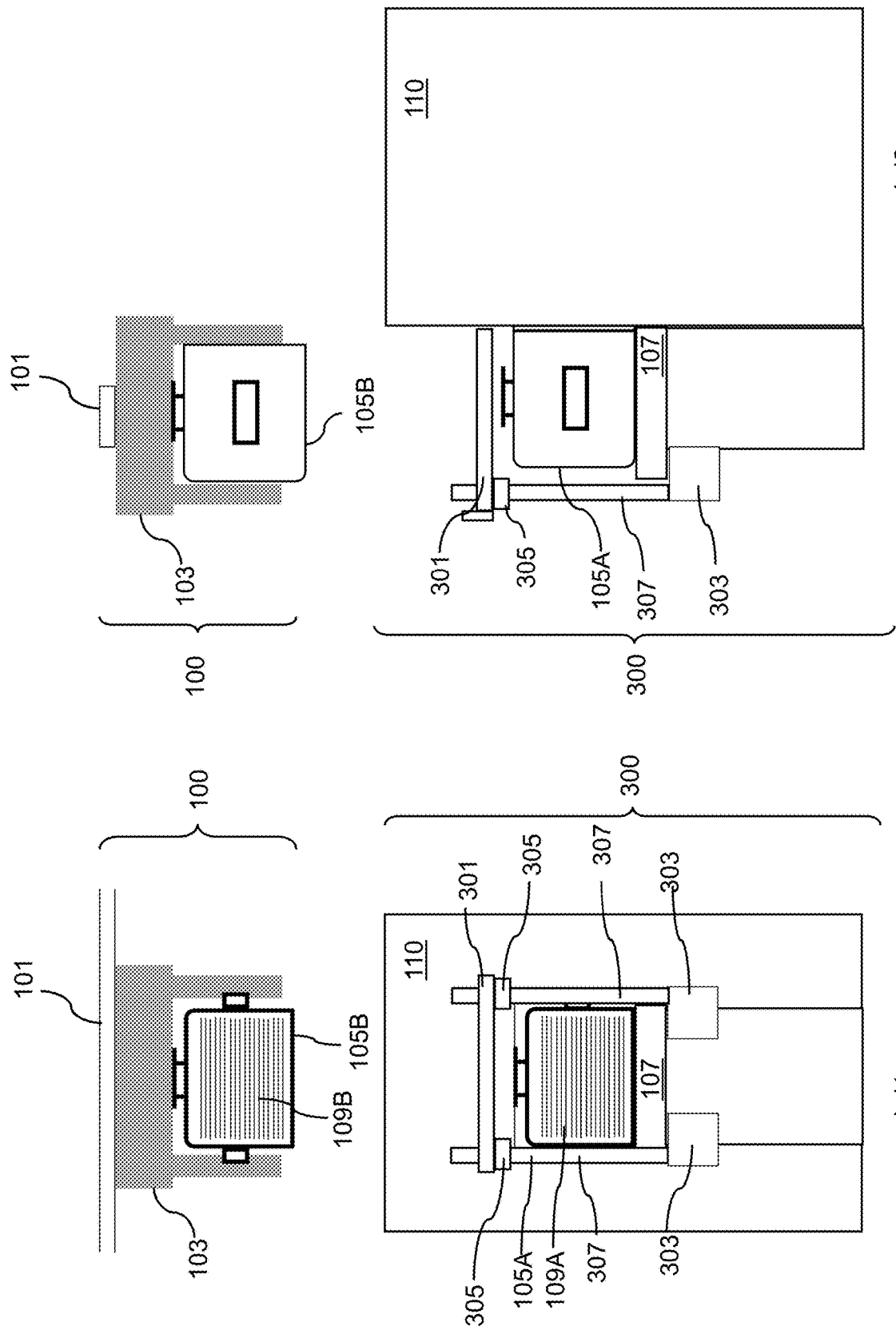

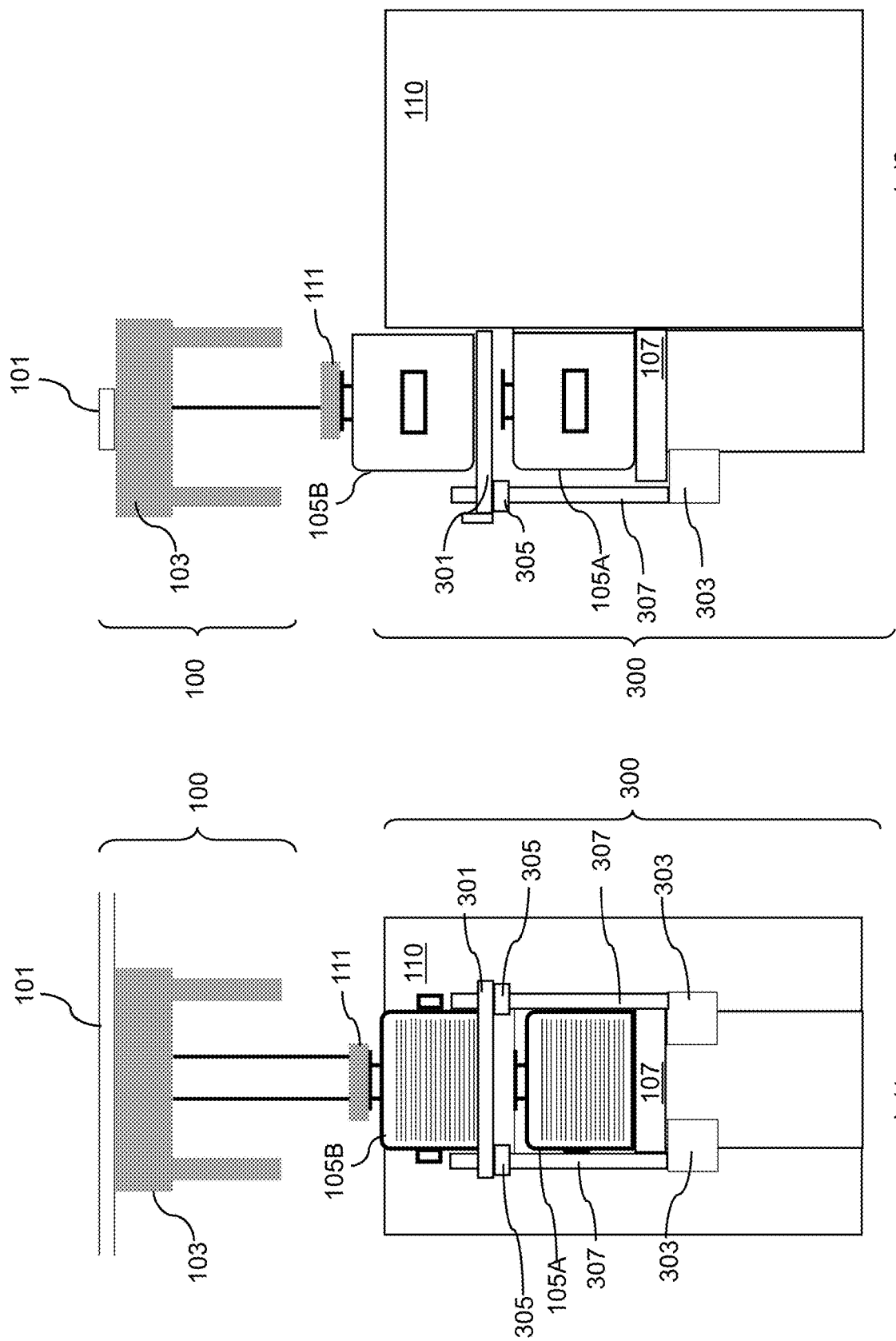

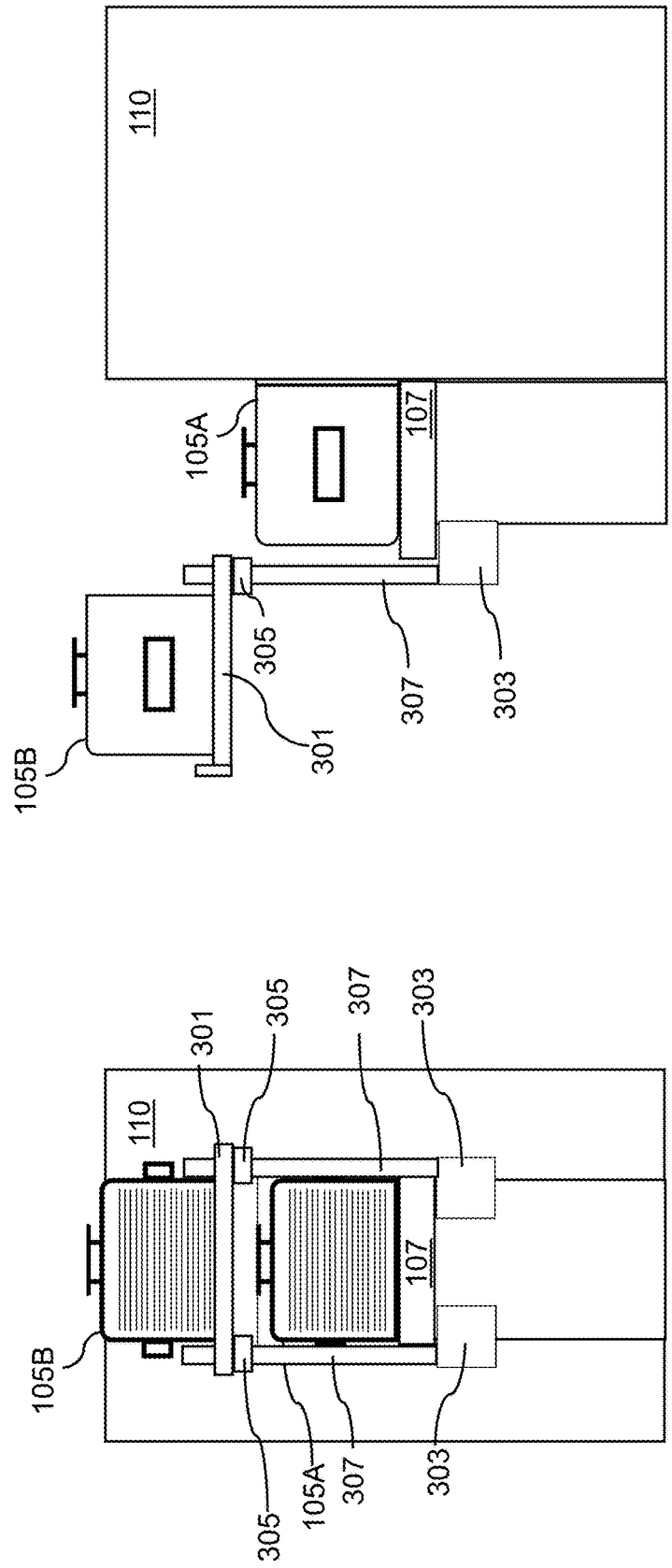

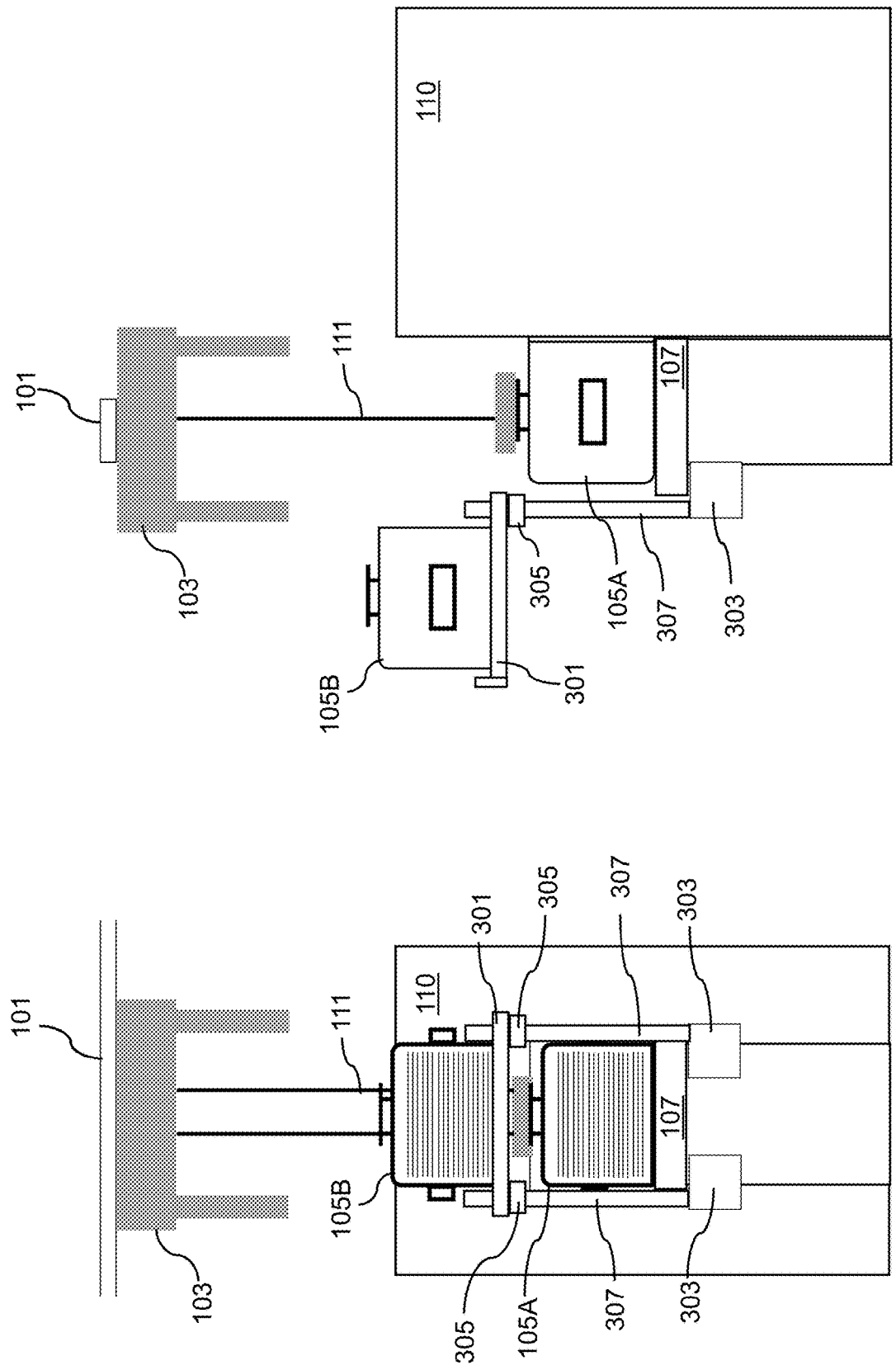

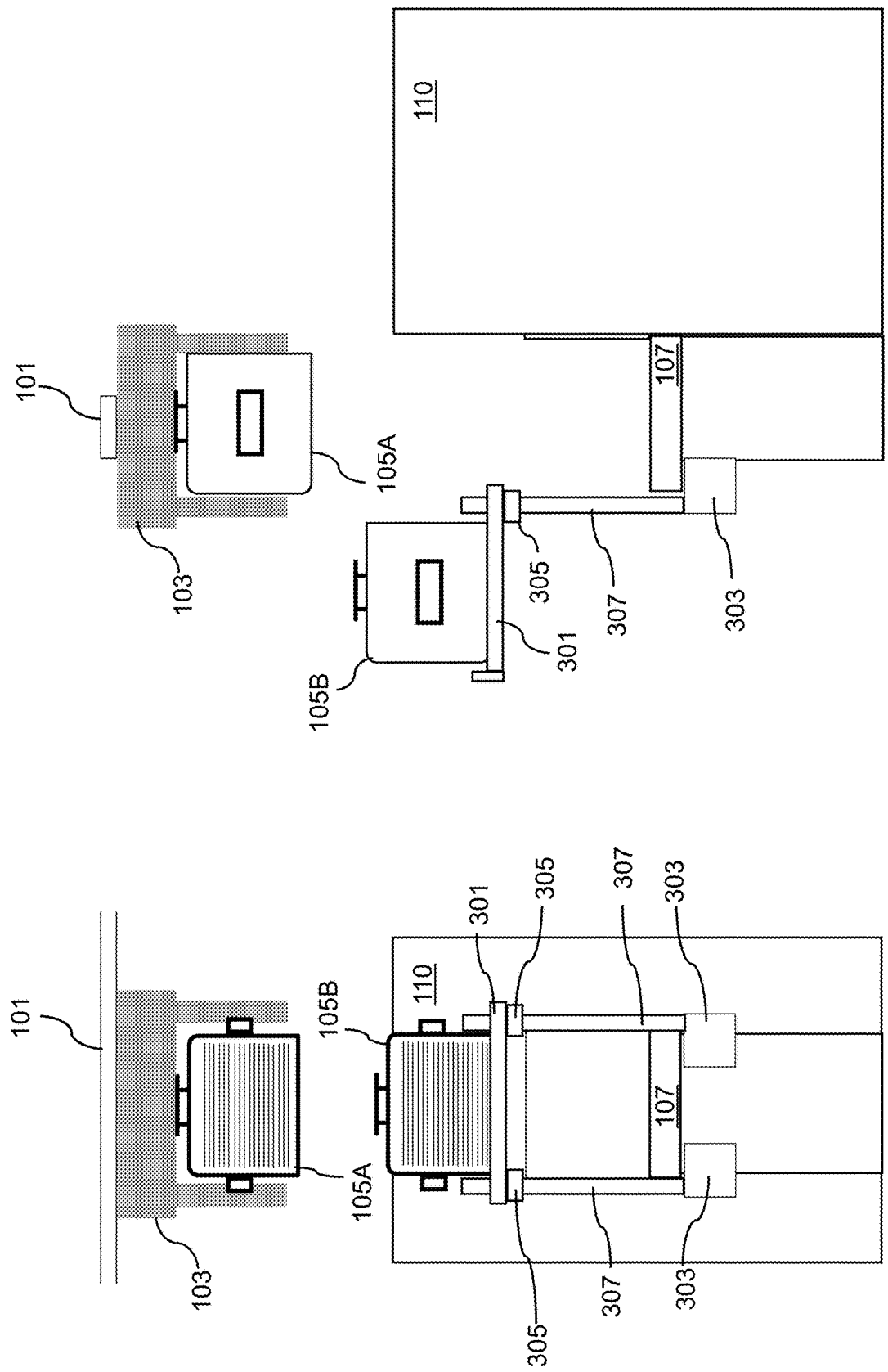

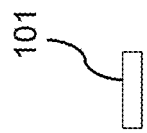
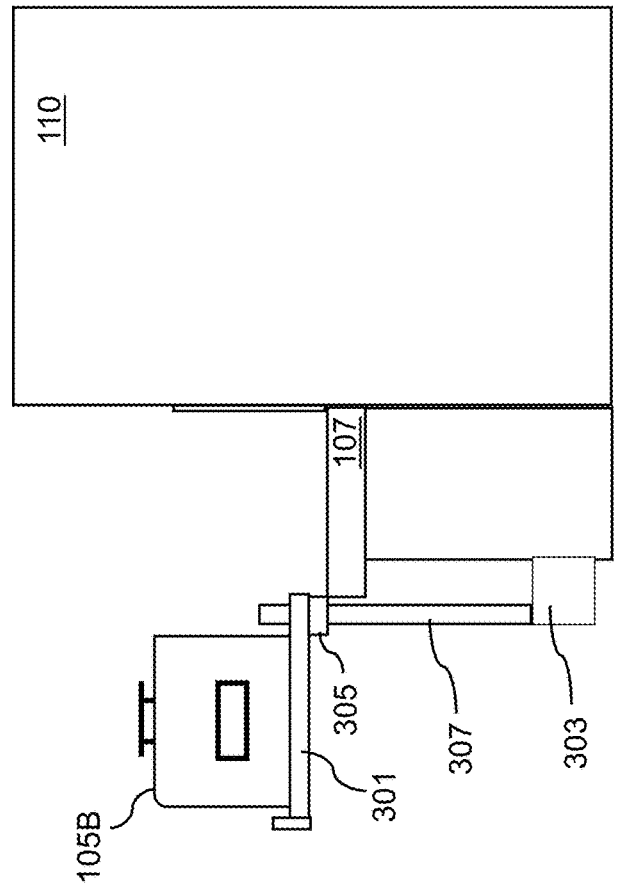
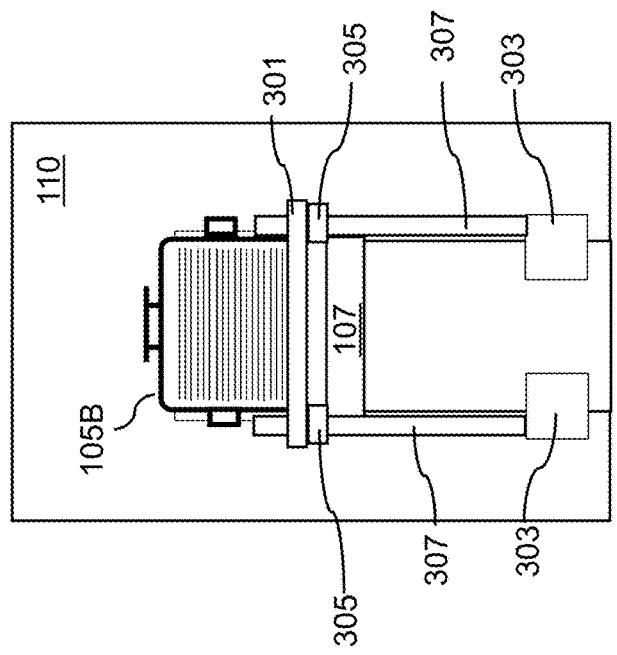
FIG. 25A
FIG. 25B

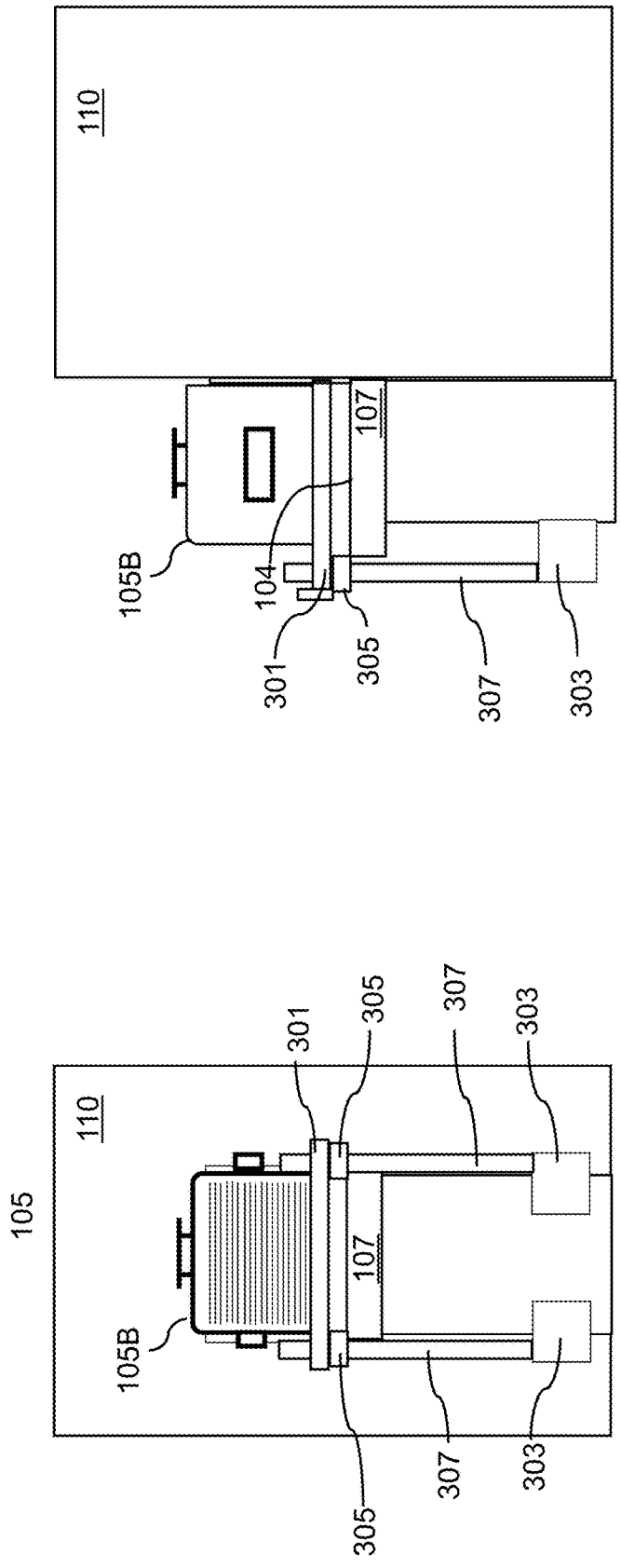

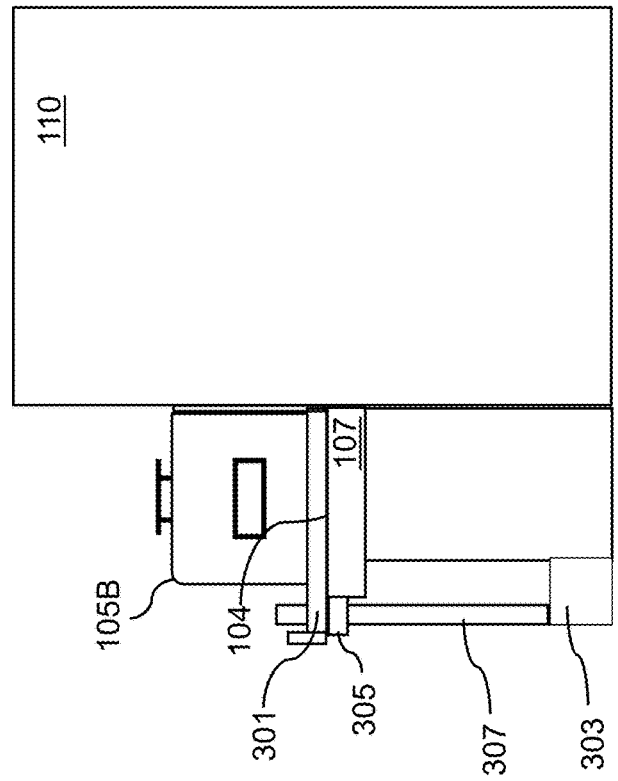
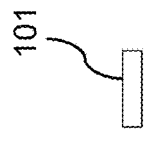
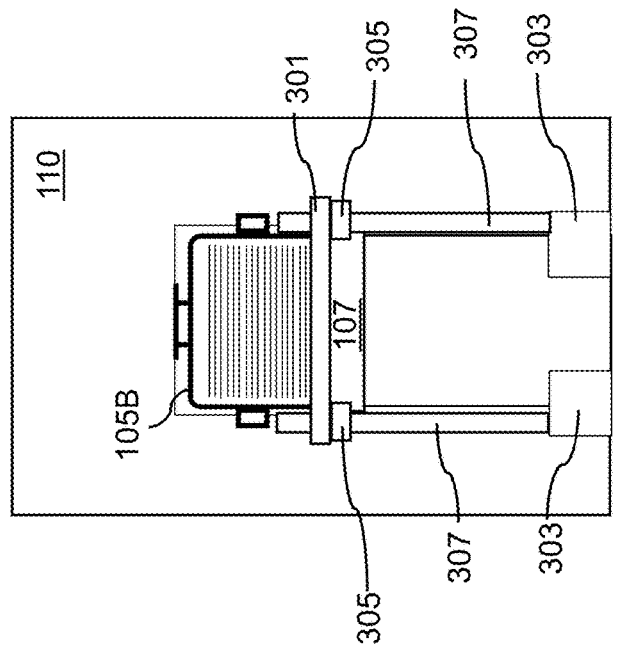
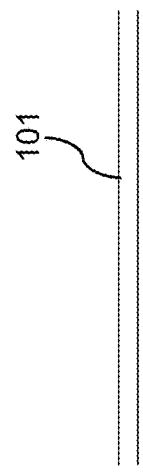
FIG. 27B
FIG. 27A

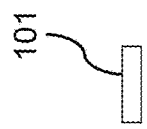
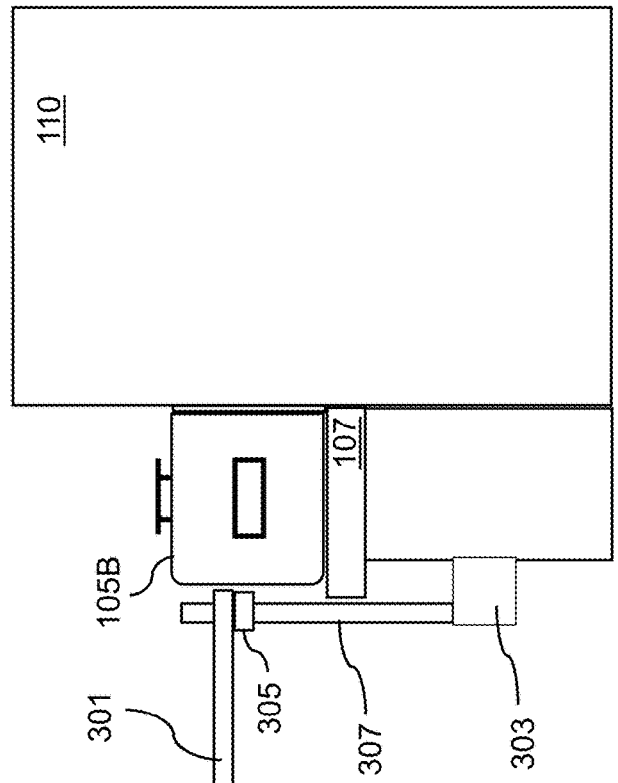
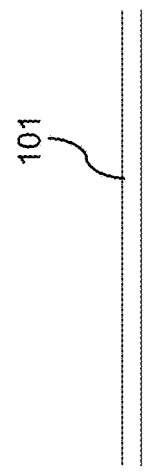
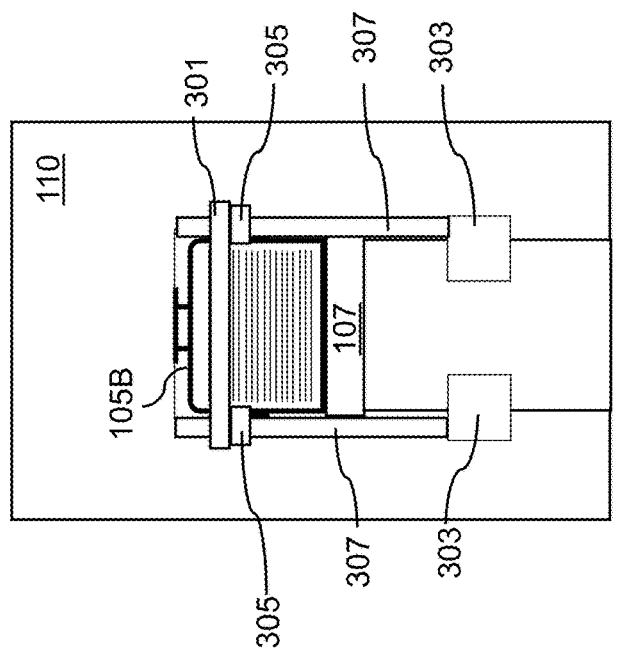
FIG. 28A
FIG. 28B

METHODS AND SYSTEMS FOR IMPROVING TRANSFER EFFICIENCY OF AN AUTOMATED MATERIAL HANDLING SYSTEM

BACKGROUND

In order to fabricate devices on a semiconductor wafer, a number of unit operations (e.g., masking, etching, deposition, implanting etc.) are performed. Semiconductor wafers may be transported from unit operation to unit operation during device fabrication. To transport the semiconductor wafers to and from each unit operation, a storage container, such as a front opening unified pod (FOUP) may be used. An automated system, such as an automated material handling system (AMHS), may be used to transport the storage containers (e.g., FOUPs) containing the wafers to multiple wafer processing apparatuses within the semiconductor fabrication plant for performing different unit operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A and 3B are front and side views, respectively, of an exemplary structure of a positioning apparatus for improving the efficiency of an automated material handling system (AMHS) according to a first embodiment of the present disclosure.

FIGS. 4A and 4B are front and side views, respectively, showing the first embodiment positioning apparatus lifting a first wafer storage container from a surface of a load port.

FIGS. 9A and 9B are front and side views, respectively, of the first embodiment positioning apparatus showing support rods and retractable hooks translated vertically downward with respect to the load port by a vertical translation mechanism.

FIGS. 10A and 10B are front and side views, respectively, of the first positioning embodiment apparatus showing a second wafer storage container loaded onto the load port and the support rods and retractable hooks returned to their original position as shown in FIGS. 3A and 3B.

FIGS. 11A, 11B and 11C are front, side and top views, respectively, of an exemplary structure of a positioning apparatus for improving the efficiency of an automated material handling system (AMHS) according to a second embodiment of the present disclosure.

FIGS. 12A and 12B are front and side views, respectively, of the second embodiment positioning apparatus showing a vertical translation mechanism moving a support tray vertically upwards to lift a first wafer storage container off the surface of a load port.

FIGS. 13A and 13B are front and side views, respectively, of the second embodiment positioning apparatus showing the support tray and the first wafer storage container moved horizontally with respect to the load port.

FIGS. 14A and 14B are front and side views, respectively, of the second embodiment positioning apparatus showing the first wafer storage container moved horizontally with respect to the load port while a second wafer storage container is loaded onto the load port by an OHT vehicle of the AMHS.

FIGS. 15A and 15B are front and side views, respectively, of the second embodiment positioning apparatus showing the first wafer storage container moved horizontally with respect to the load port and vertically raised above the load port and an upper surface of the second wafer storage container.

FIGS. 17A and 17B are front and side views, respectively, of the second embodiment positioning apparatus showing the first wafer storage container located in an OHT vehicle and the support tray moved horizontally with respect to the load port.

FIGS. 18A and 18B are front and side views, respectively, of the second embodiment positioning apparatus showing the support tray in a vertically lowered position and laterally displaced from the second wafer storage container and the load port.

FIGS. 19A and 19B are front and side views, respectively, of the second embodiment positioning apparatus showing the support tray moved horizontally such that the support tray is located above an upper surface of the load port and below a portion of the second wafer storage container.

FIGS. 20A and 20B are front and side views, respectively, of the second embodiment positioning apparatus showing a first wafer storage container loaded onto the load port and the support tray 301 located over an upper surface of the first wafer storage container.

FIGS. 21A and 21B are front and side views, respectively, of the second embodiment positioning apparatus showing the second wafer storage container lowered onto the support tray by an OHT vehicle of the AMHS.

FIGS. 22A and 22B are front and side views, respectively, of the second embodiment positioning apparatus showing the support tray and the second wafer storage container moved laterally relative to the load port and the first wafer storage container.

FIGS. 23A and 23B are front and side views, respectively, of the second embodiment positioning apparatus showing the first wafer storage container being removed from the load port by an OHT vehicle of the AMHS.

FIGS. 24A and 24B are front and side views, respectively, of the second embodiment positioning apparatus showing the first wafer storage container located in the OHT vehicle.

FIGS. 25A and 25B are front and side views, respectively, of the second embodiment positioning apparatus showing the support tray translated in a vertically downward direction to lower the second wafer storage container towards the upper surface of the load port.

FIGS. 26A and 26B are front and side views, respectively, of the second embodiment positioning apparatus showing the support tray moved in a horizontal direction to move the second wafer storage container over the upper surface of the load port.

FIGS. 27A and 27B are front and side views, respectively, of the second embodiment positioning apparatus showing the support tray lowering the second wafer storage container onto the upper surface of the load port.

FIGS. 28A and 28B are front and side views, respectively, of the second embodiment positioning apparatus showing the support tray translated in vertical and horizontal directions after the second wafer storage container is loaded onto the load port.

DETAILED DESCRIPTION

Figure 1:
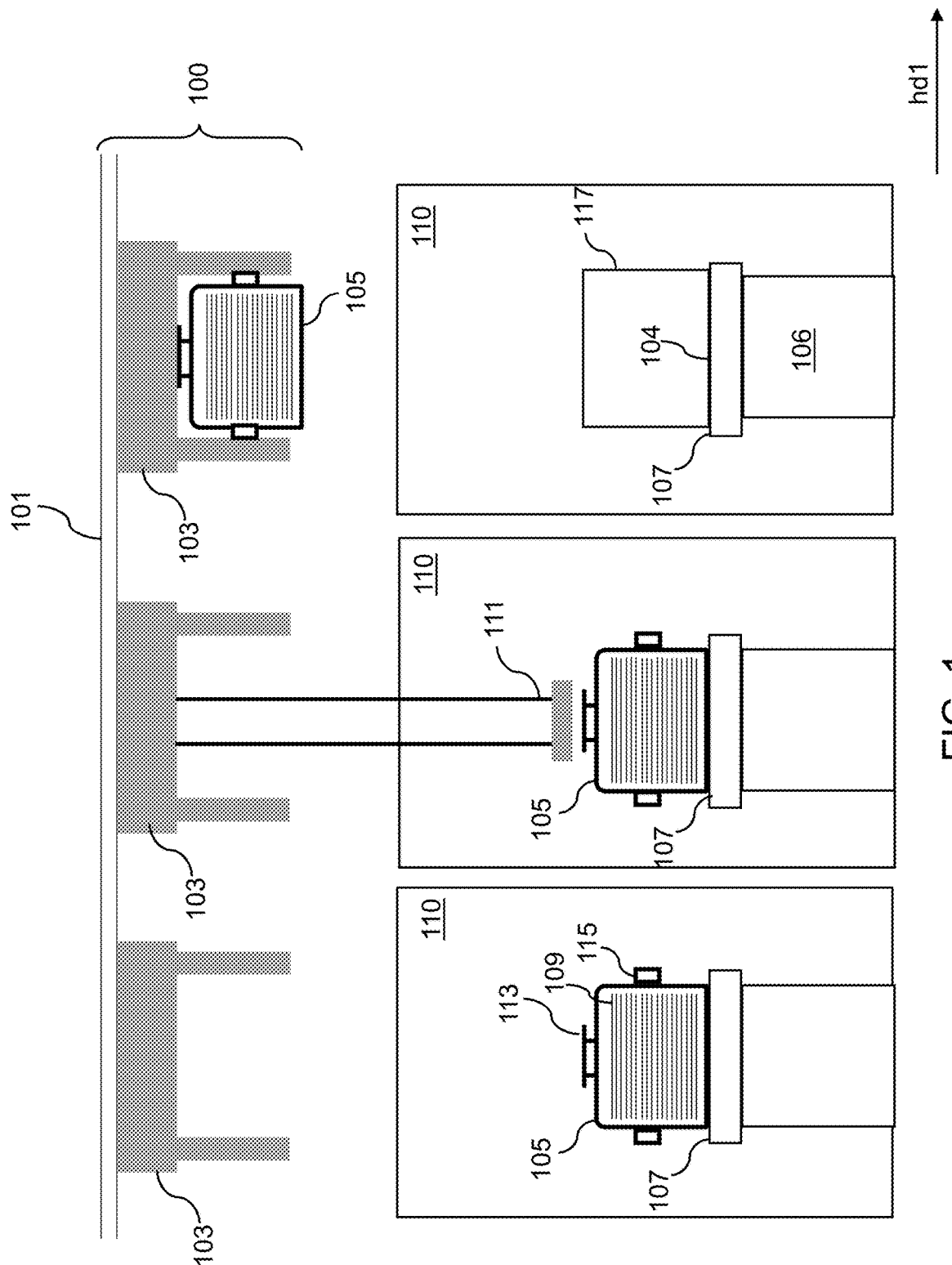
FIG. 1 is a schematic front view of a portion of a semiconductor fabrication facility including a plurality of semiconductor wafer processing apparatuses and an automated material handling system (AMHS) including a plurality of overhead hoist vehicles (OHTs) traveling on an overhead track system.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Typically, a number of different unit operations (e.g., masking, etching, deposition, implanting etc.) are performed in order to fabricate a semiconductor device. The semiconductor wafer that the semiconductor devices are fabricated upon may be transported from unit operation to unit operation during device fabrication. For example, a storage container, such as a front opening unified pod (FOUP) may be used to transport the semiconductor wafers from one unit operation to another. An automated system, such as an automated material handling system (AMHS), may be used to transport the FOUPs containing the wafers to multiple wafer processing apparatuses within the semiconductor fabrication plant for performing different unit operations. Delays in the transporting of wafers to the different processing apparatuses can decrease manufacturing efficiency and increase the cost of goods. Thus, there is a continuing need for further improvements in efficiency of material handling systems, such as automated material handling systems used in semiconductor manufacturing processes. Generally, the structures and methods of the present disclosure may be used to improve the transfer efficiency of an automated material handling system (AMHS), such as an overhead AMHS used in the semiconductor manufacturing industry.

FIG. 1 is a schematic front view of a portion of a semiconductor fabrication facility, which may also be referred to as a foundry or "fab," which may include a plurality of semiconductor wafer processing apparatuses 110 located in a controlled manufacturing environment (e.g., a clean room). Each of the wafer processing apparatuses 110 may be configured to perform one or more unit operations (e.g., masking, etching, deposition, implanting, etc.) on semiconductor wafers 109. The wafers 109 may be moved to different wafer processing apparatuses 110 in a predetermined sequence in order to fabricate integrated circuit (IC) devices on the wafer 109. In various embodiments, groups of wafers 109 may be located within each wafer storage container 105, which may be moved to different processing apparatuses 110 to perform different unit operations on the wafers contained within the wafer storage container 105. In various embodiments, the wafer storage containers 105 may be front opening unified (or universal) pods, which are also known as "FOUPs." A FOUP is a standardized container used to safely house and transport a plurality of semiconductor wafers (e.g., 25 wafers, although more or less wafers may be housed and transported) in a controlled environment. A FOUP may include handles 115 on either side of the container to enable a user to carry the FOUP and may also include features to enable the FOUP to interface with a load port 107 of a semiconductor wafer processing apparatus 110 and to be handled by an automated material handling system 100. Other types of wafer storage containers 105 for semiconductor wafers 109 are within the contemplated scope of this disclosure.

Referring again to FIG. 1, each of the wafer processing apparatuses 110 may include an interior portion within which environmental conditions may be controlled. A door 117 may enable wafers 109 to enter and exit the interior portion of the wafer processing apparatus 110. In some embodiments, a robot arm (not shown in FIG. 1) may be used to transfer semiconductor wafers 109 between the wafer storage container 105 and the interior portion of the wafer processing apparatus 110.

A load port 107 may be configured to receive and support the storage containers 105 and to provide an interface between the wafer storage container 105 and the wafer processing apparatus 110. The load port 107 may include a mounting surface 104 configured to receive and support a storage container 105. A base structure 106 may support the mounting surface 104 of the load port 107 above the floor of the manufacturing facility. In some embodiments, the base structure 106 may support the mounting surface 104 at a height that facilitates the transfer of wafers between the storage container 105 and the wafer processing apparatus 110. The load port 107 may include mechanical features (e.g., kinematic pins) that mate with corresponding features of the storage containers 105 to properly align the storage containers 105 on the load port 107. The load port 107 may also include a latch or similar mechanism to secure the wafer storage container 105 onto the load port 107. In various embodiments, the load port 107 may also include sensors to detect when a storage container 105 is located on the load port 107. The load port 107 may further include an automatic identification and data capture (AIDC) system, such as an RFID reader, to obtain identifying information and optionally additional data from the wafer storage container 105. In various embodiments, the load port 107 may be configured to advance the wafer storage container 105 towards the wafer processing apparatus 110 and to open the storage container 105 so that the wafers 109 contained within the storage container 105 may be accessed by the wafer processing apparatus 110.

Referring again to FIG. 1, the semiconductor fabrication facility may also include an automated material handling system (AMHS) 100. The AMHS 100 may be a computer-controlled automated system for moving wafer storage containers 105 to different locations in the semiconductor fabrication facility. In the embodiment shown in FIG. 1, the AMHS 100 is an overhead system that includes one or more tracks 101 that may be suspended from or otherwise mounted to the ceiling of the semiconductor fabrication facility. A plurality of vehicles 103, which may be overhead hoist transfer (OHT) vehicles, may be driven along the one or more tracks 101. FIG. 1 depicts three OHT vehicles 103 that may be driven along the track 101 in a first direction, hd1. A network of overhead tracks 101, such as shown in FIG. 1, may extend throughout the semiconductor fabrication facility to enable OHT vehicles 103 to transfer wafer storage containers 105 between different locations within the semiconductor fabrication facility.

Each OHT vehicle 103 may include a hoist mechanism 111 that may be selectively lowered from the vehicle 103 to capture a wafer storage container 105. In various embodiments, the hoist mechanism 111 may capture the wafer storage containers 105 by clamping onto a feature of the wafer storage containers 105, such as a flange 113 located at the top of the storage container 105. Once the wafer storage container 105 has been captured by the hoist mechanism 111, the hoist mechanism 111 and the wafer storage containers 105 may be retracted into the OHT vehicle 103, as shown on the right-hand side of FIG. 1. The OHT vehicle 103 may then be driven to a different location in the semiconductor fabrication facility, such as the location of another load port 107 associated with a different wafer processing apparatus 110 for performing additional unit operation(s) on the wafers 109. The OHT vehicle 103 may deliver the wafer storage container 105 to the target load port 107 by lowering the wafer storage containers 105 onto the load port 107 using the hoist mechanism 111. The OHT vehicle 103 may then release the wafer storage container 105 and retract the hoist mechanism 111, and may then travel to a different location to pick up another wafer storage container 105.

A semiconductor fabrication facility such as shown in FIG. 1 may also include a communication network that enables the AMHS 100 to communicate with the load ports 107 and/or the wafer processing apparatuses 110. In various embodiments, the load ports 107 may send messages to the AMHS 100 indicating that a wafer storage container 105 is ready to be picked up by an OHT vehicle 103 and/or that the load port 107 is ready to receive a new wafer storage container 105 for processing by the wafer processing apparatus 110.

Figure 2:
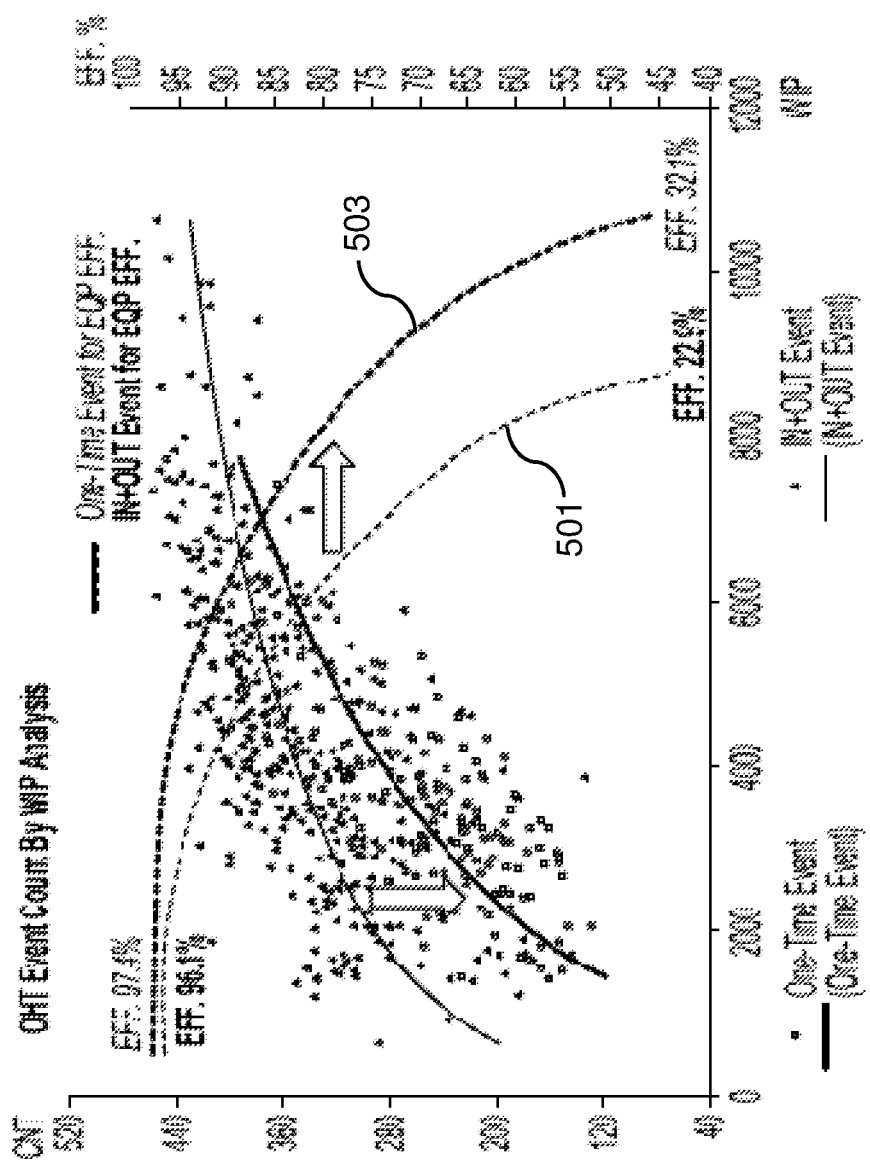
FIG. 2 is a plot showing the results of a simulation of OHT event counts vs. the total works-in-progress (WIPs) undergoing processing in a semiconductor fabrication facility.

A deficiency with existing automated material handling systems is that as the number of partially-finished semiconductor wafers or other items of manufacture (also known as "works-in-progress" (WIP)) increases, the material handling system may approach or exceed maximum capacity, leading to a significant decrease in manufacturing efficiency. This is illustrated in FIG. 2, which is a plot showing the results of a simulation of OHT event counts vs. the total WIPs undergoing processing in a semiconductor fabrication facility. Each dot in FIG. 2 represents a randomly-issued call to the AMHS 100 requesting a transfer of a wafer storage container 105 (e.g., a drop-off or a pick-up of a wafer storage containers 105 to or from a load port 107). The squares represent "one-time events" (i.e., either a drop-off or a pick-up). The triangles represent "in-and-out" events (i.e., a pick-up of a completed wafer storage container 105 and a drop-off of a new wafer storage containers 105 for processing). As shown by the solid lines in FIG. 2, the total number of calls to the AMHS is relatively low when the total number of WIPs is low, and increases with increasing WIP volume. In the simulation depicted in FIG. 2, as the WIP count approaches 10,000, the AMHS 100 is operating at or near full capacity. The efficiency of the manufacturing equipment (e.g., the wafer processing apparatuses 110) decreases rapidly with an increasing WIP count, as indicated by the dotted lines 501, 503 in FIG. 2. This problem is particularly acute for "in-and-out" events (shown by the dotted line 501 in FIG. 2), which require a higher volume of OHT calls and result in significantly lower equipment efficiency than "one-time events" (shown by the dotted line 503 in FIG. 2).

One reason for this is that in an overhead AMHS 100 such as shown in FIG. 1, an "in-and-out" process may include the AMHS 100 locating an empty OHT vehicle 103 and transporting the OHT vehicle 103 to the target load port 107 to pick up the completed wafer storage containers 105, while also including the AMHS 100 locating and directing a second OHT vehicle 103 to obtain an additional wafer storage container 105 containing wafers 109 ready-for-processing and delivering the new wafer storage container 105 to the target load port 107. With a large volume of WIPs, the corresponding large quantity of calls to the AMHS 100 can result in frequent delays and "traffic jams" on the AMHS 100. This may significantly reduce manufacturing efficiency and throughput, may potentially result in spoilage of inventory, and may increase the per unit manufacturing costs.

Accordingly, various embodiments disclosed herein provide methods and systems for improving the efficiency of an automated material handling system (AMHS). In various embodiments, a positioning apparatus operatively coupled to a load port of a processing apparatus may be configured to remove a first work-in-process from the load port and to move the first work-in-process along a first direction (e.g., a horizontal direction) to displace the first work-in-progress from the load port while a second work-in-progress is transferred to the load port from an AMHS vehicle along a second direction (e.g., a vertical direction) that is perpendicular to the first direction. The first work-in-progress may then be transferred from the positioning apparatus to an AMHS vehicle along the second direction. In various embodiment, the first and second works-in-progress (WIPs) may be semiconductor wafers 109 located in respective wafer storage containers 105 (e.g., FOUPs). In various embodiments, a single AMHS vehicle 103 may be used to both load a work-in-progress onto the load port 107 for processing and to unload an already-processed work-in-progress from the load port 107, which can reduce the transfer time and vehicle traffic on the AMHS, thereby increasing the efficiency of the AMHS.

In another mode of operation, an AMHS vehicle 103 may transfer works-in-progress to be processed onto the positioning apparatus, which may function as a "buffer" by holding the works-in-progress until the works-in-progress that are currently being processed are transferred to an AMHS vehicle 103. Then, the positioning apparatus may transfer the works-in-progress to be processed from the positioning apparatus to the load port 107. This may significantly reduce the time required to transfer works-in-progress to the load port, and may also reduce AMHS congestion, resulting in improved manufacturing efficiency and lower cost.

FIGS. 3A and 3B are front and side views, respectively, of an exemplary structure of a positioning apparatus 200 for improving the efficiency of an automated material handling system (AMHS) 100, such as an overhead AMHS 100 used in a manufacturing facility, such as a semiconductor fabrication facility, according to a first embodiment of the present disclosure. Referring to FIGS. 3A and 3B, the positioning apparatus 200 includes a pair of support rods 201 located adjacent to a load port 107. The support rods 201 may be mounted to the sides of the base structure 106 of the load port 107 as shown in FIGS. 3A and 3B. Alternatively, the support rods 201 may be mounted to a different supporting structure, such as the floor of the semiconductor fabrication facility or to the processing apparatus 110. The support rods 201 may be mounted such that they are pivotable with respect to the load port 107 via a pivot joint 205, as shown in FIG. 3B. A pivot drive system 210 may drive the pivoting motion of the support rods 201 with respect to the load port 107. A vertical translation mechanism 208 may enable the support rods 201 to move vertically with respect to the load port 107. Connected to the upper ends of each of the support rods 201 may be retractable hooks 203. The retractable hooks 203 may be referred to as a support element that is configured to support the wafer storage containers 105 that transport the works-in-progress to the load port 107. FIG. 3A illustrates the retractable hooks 203 in an extended position, such that the upper surface of each retractable hook 203 is located directly below a portion of a wafer storage container 105 located on the load port 107. The wafer storage container 105 may include a plurality of works-in-progress (WIPs), which may be semiconductor wafers 109. The WIPs may be processed by a processing apparatus 110 that may be associated with the load port 107. In various embodiments, the wafer storage container 105 may be a semiconductor wafer storage container, such as a FOUP. The upper surfaces of the retractable hooks 203 may be located below the handles 115 of the wafer storage container 105 when the retractable hooks 203 are in an extended position. The retractable hooks 203 may be connected to the respective support rods 201 by a pivot joint 207 that enables the retractable hooks 203 to pivot from an extended position as shown in FIGS. 3A and 3B to a retracted position (see FIGS. 9A and 9B). In various embodiments, the first embodiment positioning apparatus 200 including the support rods 201, vertical translation mechanism 208, and retractable hooks 203, may be coupled to and supported by the load port 107. In various embodiments, the first embodiment positioning apparatus 200 may also be operatively coupled to the load port 107, such that the load port 107 may control the first embodiment positioning apparatus 200 to perform operations related to the loading of wafer storage containers 105 onto the load port 107 and the unloading of wafer storage containers 105 from the load port 107.

Figure 30:
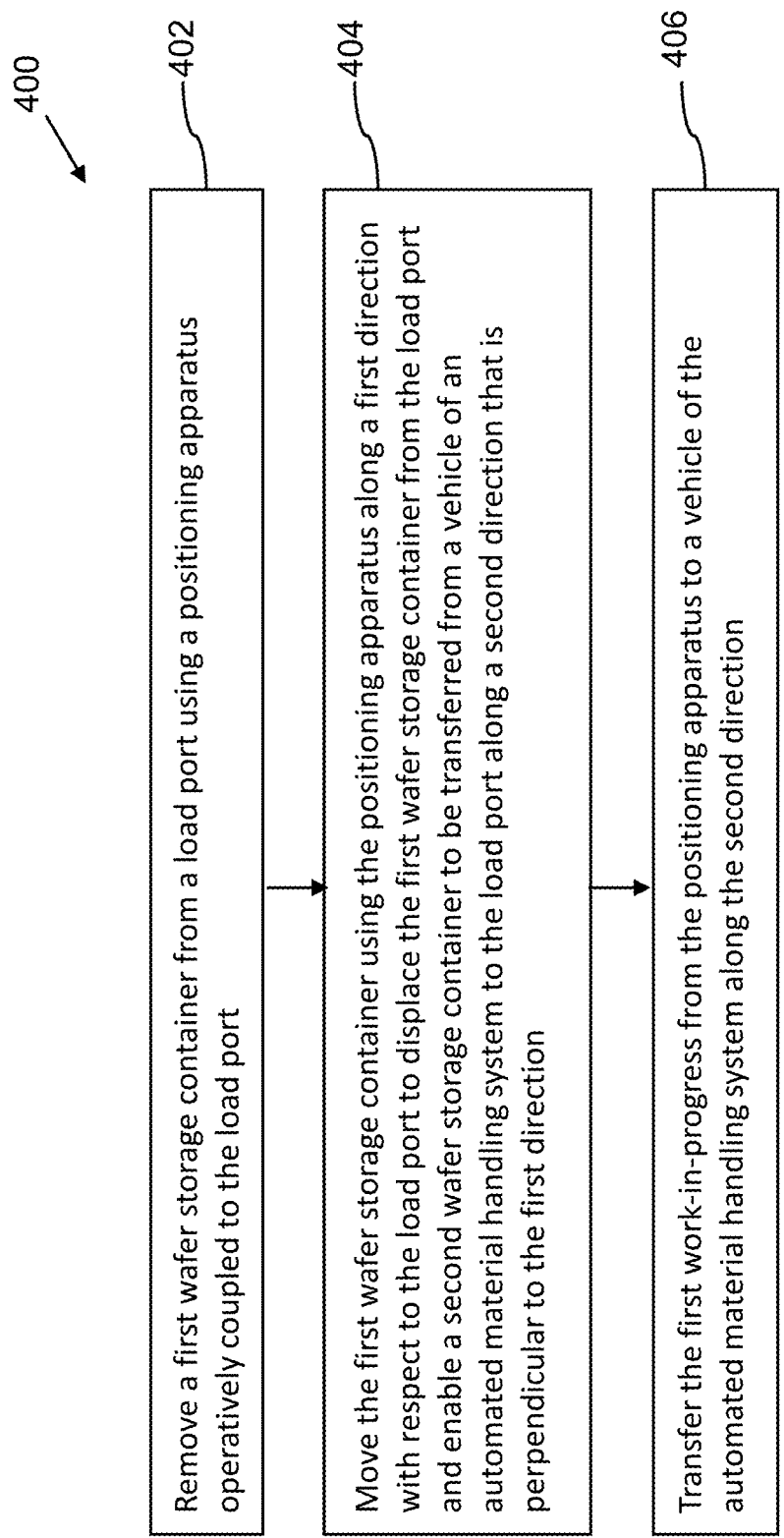
FIG. 30 is a flowchart illustrating a method of processing semiconductor wafers according to an embodiment.

FIGS. 4A-10B are sequential front and side views, respectively, of the first embodiment positioning apparatus 200 shown in FIGS. 3A and 3B illustrating an exemplary process for unloading a first wafer storage container 105A from a load port 107 and loading a second wafer storage container 105B on the load port 107 (i.e., an "in-and-out" event) according to an embodiment of the disclosure. FIG. 30 is a flowchart illustrating a method 400 of processing semiconductor wafers that includes removing a first wafer storage container 105A from a load port 107 and loading a second wafer storage container 105B on the load port 107 (i.e., an "in-and-out" event) according to an embodiment of the disclosure. Referring to FIGS. 3A-3B and 4A-4B and step 402 of method 400, when unloading (i.e., removing) a first wafer storage container 105A from the load port 107, the vertical translation mechanism 208 of the first embodiment positioning apparatus 200 may translate the support rods 201 vertically upwards from the first position shown in FIGS. 3A and 3B to the second position shown in FIGS. 4A and 4B. In various embodiments, the vertical translation mechanism 208 may include a motor and a linear actuator (e.g., belt drive, lead screw, ball screw, rack and pinion, etc.) coupled to the support rods 201 that translate the support rods 201 vertically with respect to the load port 107. As the support rods 201 move vertically upwards from the position shown in FIGS. 3A and 3B, the upper surfaces of the retractable hooks 203 engage the handles 115 of the first wafer storage container 105A located on the load port 107. As the support rods 201 continue to translate vertically upwards, the retractable hooks 203 remove the first wafer storage container 105A, including at least one semiconductor wafer contained therein, from the load port 107 by lifting the first wafer storage container 105A off of the mounting surface 104 of the load port 107. The first wafer storage container 105A may then be supported by the retractable hooks 203. The vertical translation mechanism 208 may continue to translate the retractable hooks 203 in a vertically upward direction to raise the first wafer storage container 105A to the position shown in FIGS. 4A and 4B. Although in the embodiment shown in FIGS. 4A and 4B, the retractable hooks 203 engage the handles 115 of the first wafer storage container 105A, it will be understood that the retractable hooks 203 may engage with any part of the first wafer storage container 105A that enables the retractable hooks 203 to lift the first wafer storage container 105A from the load port 107.

Referring again to FIGS. 4A and 4B, an OHT vehicle 103 is shown carrying a second wafer storage container 105B containing WIPs (e.g., semiconductor wafers) for processing by the processing apparatus 110. In various embodiments, when the processing of the WIPs of the first wafer storage container 105A is complete, the load port 107 may issue a call to the AMHS 100 to retrieve the first wafer storage container 105A and load a second wafer storage container 105B onto the load port 107. The load port 107 may also direct the support rods 201 and retractable hooks 203 to raise the first wafer storage container 105A to the position shown in FIGS. 4A and 4B while the load port 107 awaits the arrival of the OHT vehicle 103 carrying the second wafer storage container 105B. Alternatively, the first wafer storage container 105A may not be raised until the OHT vehicle 103 carrying the second wafer storage container 105B arrives at the load port 107.

Figure 5B:
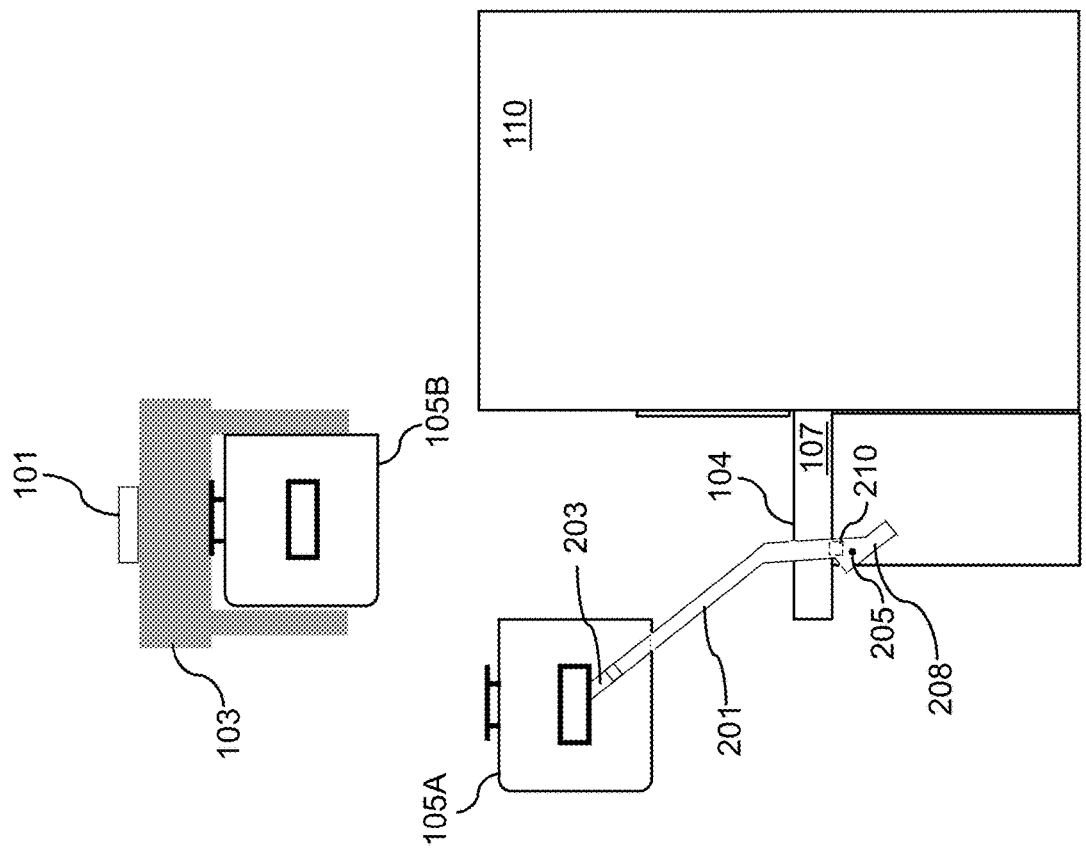
FIGS. 5A and 5B are front and side views, respectively, of the first embodiment positioning apparatus showing the first wafer storage container in a raised position and moved horizontally with respect to the load port.
Figure 5A:
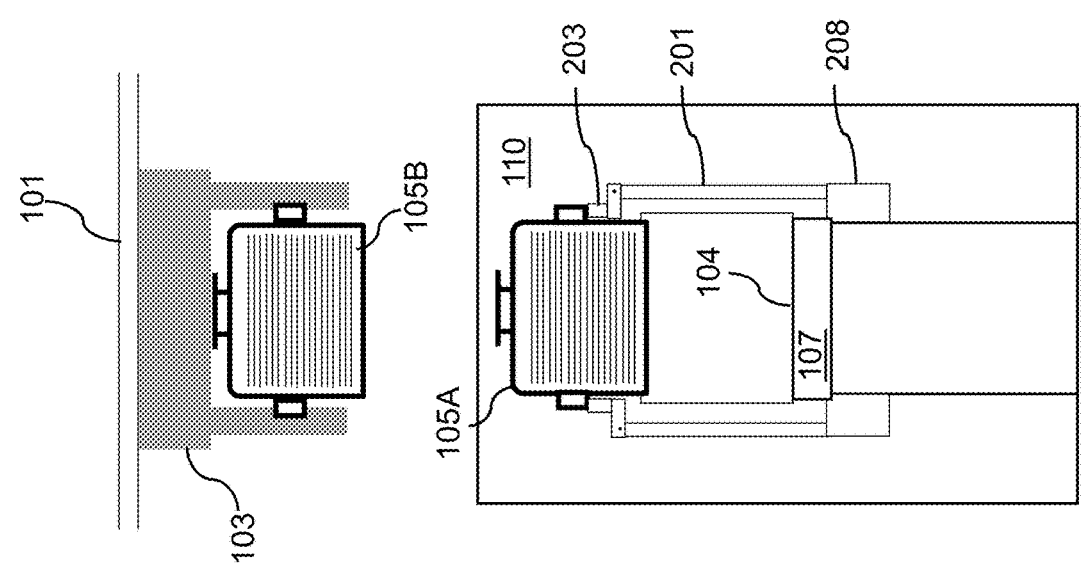

FIGS. 5A and 5B are front and side views, respectively, of the first embodiment positioning apparatus 200 showing the first wafer storage container 105A in a raised position and moved horizontally with respect to the load port 107. Referring to FIGS. 5A and 5B and step 404 of method 400, the pivot drive mechanism 210 may pivot the support rods 201 and retractable hooks 203 on the pivot joint 205 with respect to the load port 107. The pivoting motion of the support rods 201 and retractable hooks 203 causes the first wafer storage container 105A to move in a first direction, which may be a horizontal direction (i.e., parallel to the direction of arrow hd2) with respect to the load port 107, as shown in FIG. 5B. A motorized system, such as a rotary drive system 210, may drive the pivoting motion of the support rods 201 and the retractable hooks 203 with respect to the load port 107.

Figure 6B:
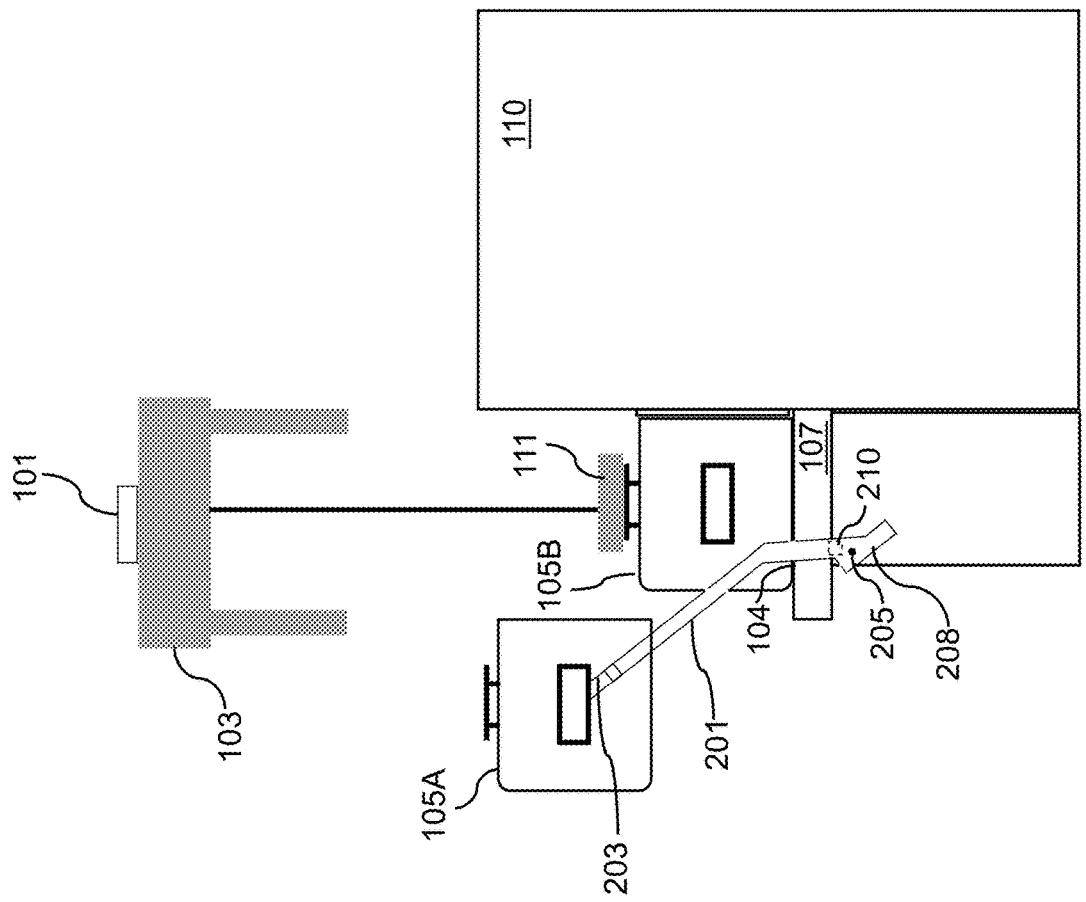
FIGS. 6A and 6B are front and side views, respectively, of the first embodiment positioning apparatus showing the first wafer storage container in a raised position and moved horizontally with respect to the load port while a second wafer storage container is loaded onto the load port by an OHT vehicle of the AMHS.
Figure 6A:
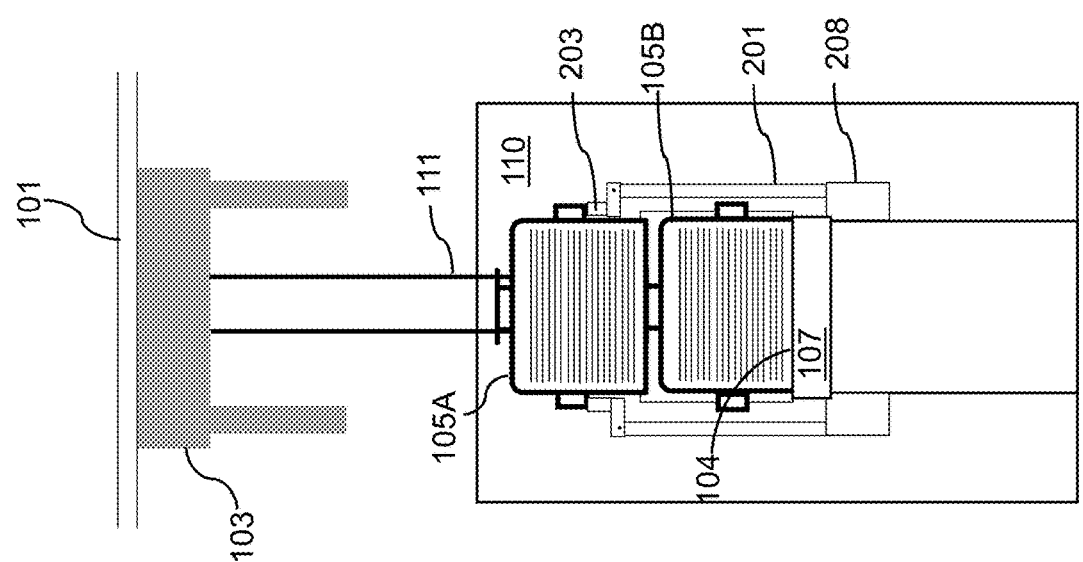

FIGS. 6A and 6B are front and side views, respectively, of the first embodiment apparatus 200 showing the first wafer storage container 105A in a raised position and moved horizontally with respect to the load port 107 while a second wafer storage container 105B may be loaded onto the load port 107 by the hoist mechanism 111 of the OHT vehicle 103. Referring to FIGS. 6A and 6B and step 406 of method 400, because the first wafer storage container 105A may be displaced from the load port 107 along a first direction (i.e., a horizontal direction) by the pivoting motion of the support rods 201 and retractable hooks 203, the hoist mechanism 111 of the OHT vehicle 103 may transfer the second wafer storage container 105B, including at least one second work-in-progress contained therein, to the load port 107 along a second direction (i.e., a vertical direction) that is perpendicular to the first direction. As shown in FIGS. 6A and 6B, the second wafer storage container 105B may be lowered vertically onto the mounting surface 104 of the load port 107 by the hoist mechanism 111 without being obstructed by the first wafer storage container 105A.

Figure 7B:
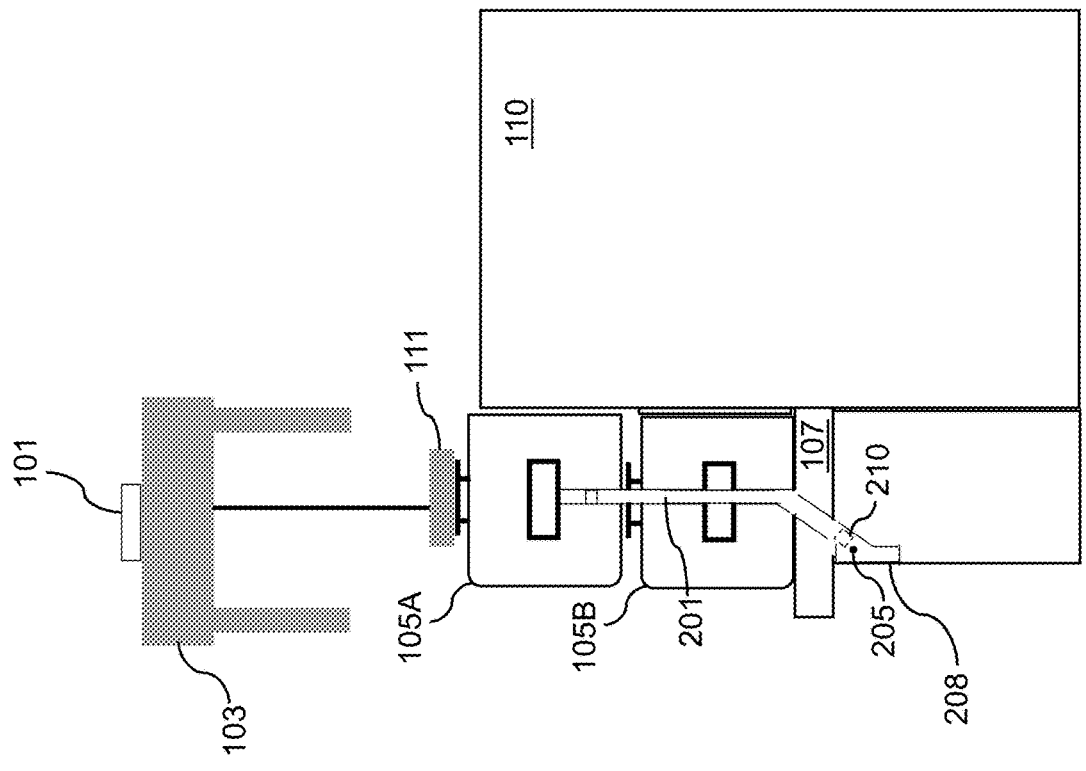
FIGS. 7A and 7B are front and side views, respectively, of the first embodiment positioning apparatus showing the first wafer storage container in a raised position and moved horizontally over the second wafer storage container by a pivoting motion of a pair of support rods and retractable hooks of the apparatus.
Figure 7A:
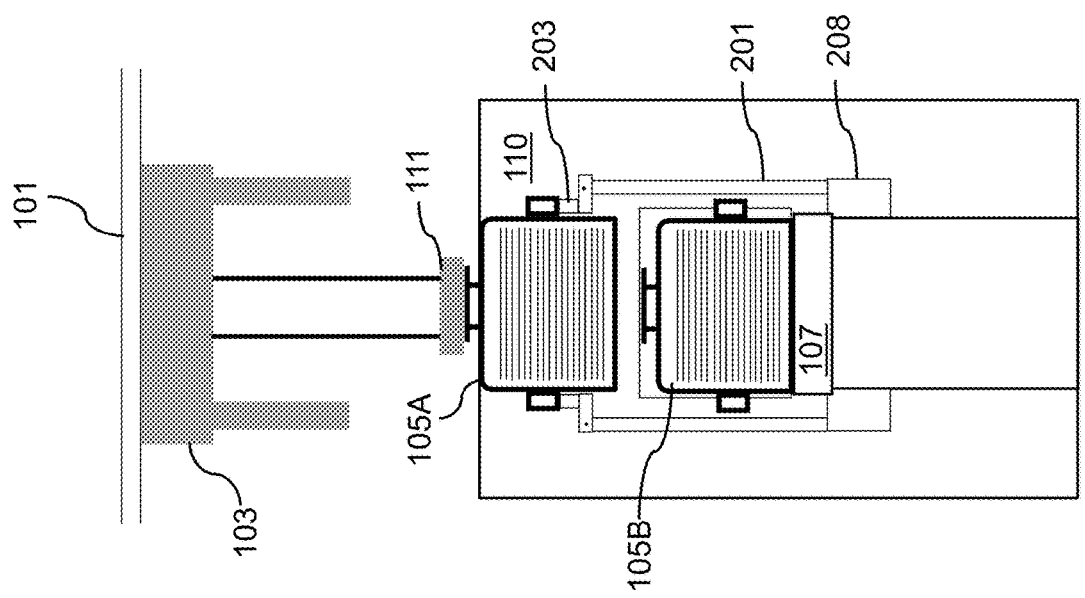

FIGS. 7A and 7B are front and side views, respectively, of the first embodiment positioning apparatus 200 showing the first wafer storage container 105A in a raised position and moved horizontally over the second wafer storage container 105B by the pivoting motion of the support rods 201 and the retractable hooks 203. Referring to FIGS. 7A and 7B, the support rods 201 and retractable hooks 203 may be pivoted on the pivot joints 205 back to the position of FIGS. 5A and 5B causing the first wafer storage container 105A to move in a horizontal direction (i.e., parallel to the direction of arrow hd2) so that the first wafer storage container 105A may be located above the upper surface of the second wafer storage container 105B that has been loaded onto the load port 107.

Referring again to FIGS. 7A and 7B, an empty OHT vehicle 103 positioned over the load port 107 may lower its hoist mechanism 111 to capture the first wafer storage container 105A for transport of the first wafer storage container 105A to another location in the semiconductor fabrication facility.

Figure 8B:
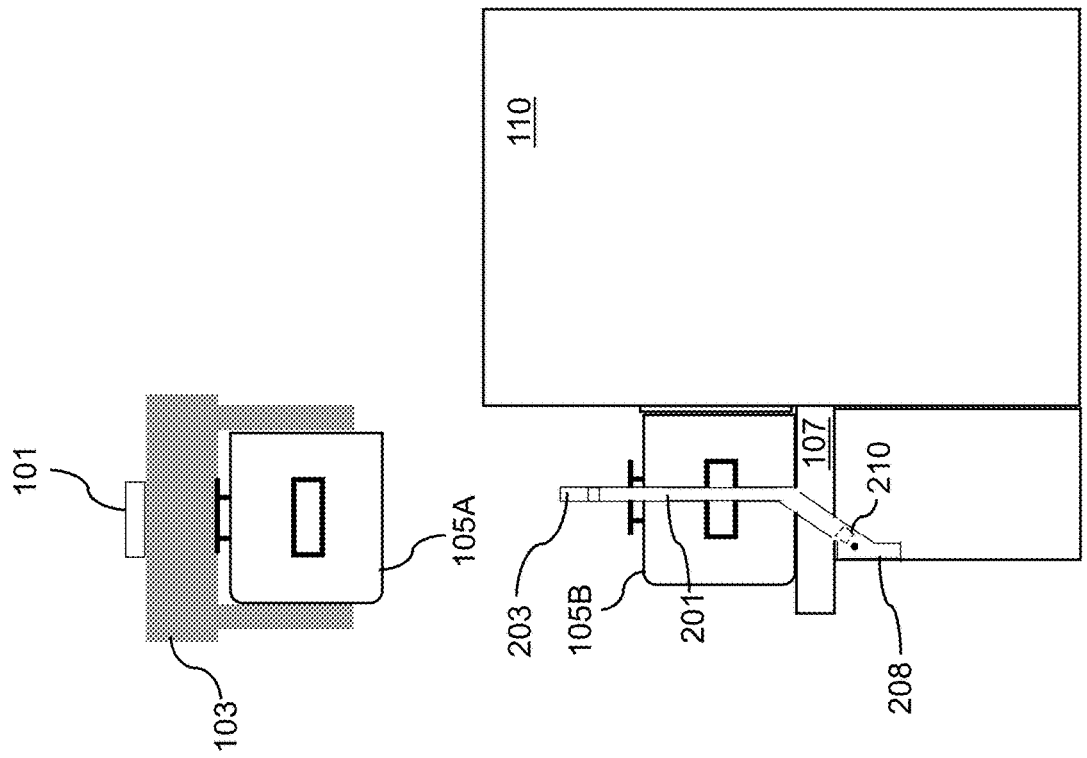
FIGS. 8A and 8B are front and side views, respectively, of the first embodiment positioning apparatus showing a second wafer storage container loaded onto the load port and the first wafer storage container raised to the OHT vehicle of the AMHS.
Figure 8A:
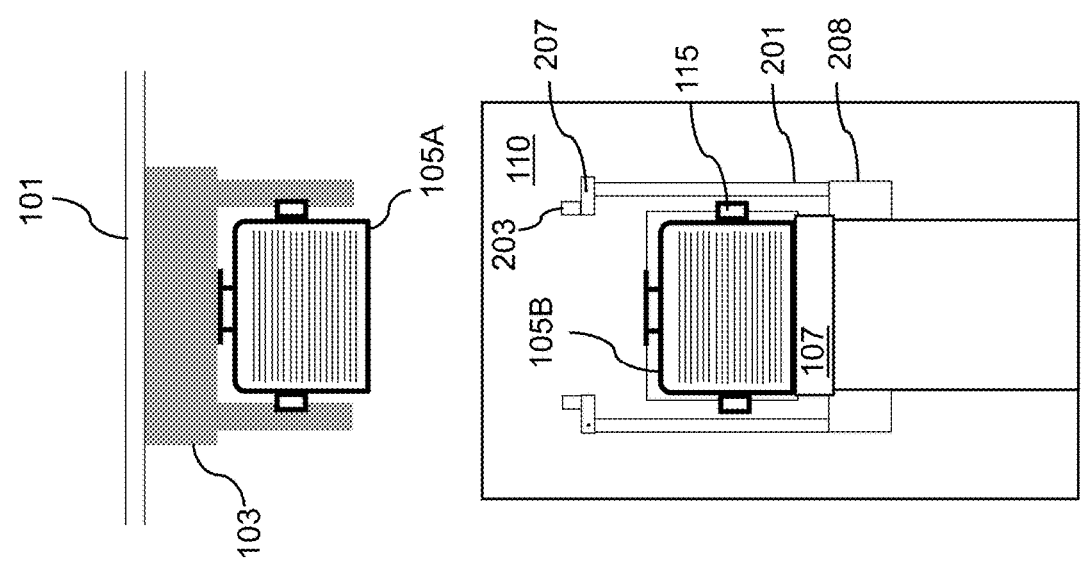

FIGS. 8A and 8B are front and side views, respectively, of the first embodiment positioning apparatus 200 showing the second wafer storage container 105B loaded onto the load port 107 and the first wafer storage container 105A raised to the OHT vehicle 103. Referring to FIGS. 8A and 8B and step 406 of method 400, the first wafer storage container 105A, including at least one first work-in-progress contained therein, may be transferred from the first embodiment positioning apparatus 200 to the OHT vehicle 103 along the second (i.e., vertical) direction. In various embodiments, the empty OHT vehicle 103 that picks up the first wafer storage container 105A from the load port 107 may be the same OHT vehicle 103 that delivered the second wafer storage container 105B to the load port 107. Thus, by utilizing a positioning apparatus 200 according the first embodiment of the present disclosure, a single OHT vehicle 103 may be used to complete an "in-and-out" event at the load port 107. This may result in a significant time savings and may improve the overall manufacturing efficiency of the fabrication facility.

FIGS. 9A and 9B are front and side views, respectively, of the first embodiment positioning apparatus 200 showing the support rods 201 and retractable hooks 203 translated vertically downward with respect to the load port 107 by the vertical translation mechanism 208. Referring to FIGS. 9A and 9B, as the support rods 201 and retractable hooks 203 translate vertically downward, the lower surfaces of the retractable hooks 203 contact the upper surfaces of the handles 115 of the second wafer storage container 105B. The retractable hooks 203 may pivot on the pivot joints 207 from an extended position to a retracted position as shown in FIGS. 9A and 9B. In various embodiments, the retractable hooks 203 may be biased into the extended position by a spring mechanism. As the support rods 201 are translated downward, the force exerted on the retractable hooks 203 by the handles 115 of the second wafer storage container 105 may be sufficient to overcome the spring bias force and cause the retractable hooks 203 to pivot to a retracted position. This may enable the hooks 203 to be lowered below the height of the handles 115 of the second wafer storage container 105B.

FIGS. 10A and 10B are front and side views, respectively, of the first embodiment positioning apparatus 200 showing the support rods 201 and the retractable hooks 203 returned to their original position shown in FIGS. 3A and 3B. In embodiments, the bias force of the spring(s) may cause the retractable hooks 203 to return to an extended position once they are lowered beneath the handles 115 of the second wafer storage container 105B, such that the upper surfaces of the retractable hooks 203 are located directly beneath the handles 115 of the second wafer storage container 105B. When the support rods 201 and retractable hooks 203 are fully lowered as shown in FIGS. 10A and 10B, the positioning apparatus 200 may be used to unload the second wafer storage container 105B from the load port 107 and to load an additional wafer storage container 105 (not shown) onto the load port 107 via the process shown and described above with reference to FIGS. 4A-10B.

Although the first embodiment positioning apparatus 200 has been described above as including spring-biased retractable hooks 203 that engage with the handles 115 of a wafer storage container 105, such as a FOUP, to lift the wafer storage container 105 from the load port 107, it will be understood that other configurations are within the contemplated scope of disclosure. For example, rather than spring-biased retractable hooks 203, the retractable hooks 203 may include a motorized system configured to pivot the hooks 203 into either an extended position (as shown in FIGS. 3A-8B and 10A-10B) or a retracted position (as shown in FIGS. 9A and 9B). Alternatively, the retractable hooks 203 may be designed to return to an extended position under force of gravity, without requiring a spring bias mechanism, once the retractable hooks 203 are lowered below the height of the handles 115 of the wafer storage container 105. Furthermore, although the first embodiment positioning apparatus 200 shown in FIGS. 3A-10B includes retractable hooks 203 having an upper surface that engages with the underside of the handles 115 of the wafer storage container 105, as noted above the retractable hooks 203 may engage with any feature of the wafer storage container 105 that enables the positioning apparatus 200 to lift the wafer storage container 105 from the load port 107 and move the wafer storage container 105 in a horizontal direction relative to the load port 107. For example, the retractable hooks 203 may be configured to selectively clamp onto side surfaces of the wafer storage container 105 in order to lift the wafer storage container 105. The retractable hooks 203 may then retract away from the side surfaces of the wafer storage container 105 as the support rods 201 and retractable hooks 203 are lowered back to their initial position.

A first embodiment positioning apparatus 200 according to the present disclosure may provide significant cost savings and efficiency improvements for an AMHS 100. The Delivery Time Accuracy-Out (DTA-OUT) in an AMHS 100 system such as shown and described above may be defined as the time between when a request is made to the AMHS 100 to pick up a wafer storage container 105 from the load port 107 and when the wafer storage container 105 is actually picked up from the load port 107 by the AMHS vehicle 103. In a conventional overhead AMHS 100 system such as shown and described with reference to FIG. 1, the average DTA-OUT may be on the order of ~55 seconds. In comparison, an AMHS utilizing a first embodiment positioning apparatus 200 according to the present disclosure may have an average DTA-OUT of ~10 seconds. In various embodiments, an AMHS utilizing a first embodiment apparatus 200 may have an average DTA-OUT that is at least 50%, such as at least 75%, including more than 80% lower than the average DTA-OUT of a conventional AMHS.

Furthermore, by utilizing a first embodiment apparatus 200 according to the present disclosure, the total event count of the AMHS 100 may be reduced by at least about 20%, including by 30% or more. This may provide significant cost savings, including up to ⅓ of the cost or more for an overhead AMHS.

FIGS. 11A, 11B and 11C are front, side and top views, respectively, of an exemplary structure of a positioning apparatus 300 for improving the efficiency of an automated material handling system (AMHS) 100, such as an overhead AMHS 100 used in a semiconductor manufacturing facility, according to a second embodiment of the present disclosure. Referring to FIGS. 11A and 11B, the second embodiment positioning apparatus 300 includes a support tray 301 that may be coupled to and supported by at least one vertical support 307. The support tray 301 may be referred to as a support element that is configured to support the wafer storage containers 105 that transport the works-in-progress to the load port 107. In the embodiment shown in FIGS. 11A and 11B, the support tray 301 is supported by a pair of vertical supports 307, although it will be understood that the support tray 301 may be supported by more than two vertical supports 307 or by a single vertical support 307. The support tray 301 and the at least one vertical support 307 may be mounted to a load port 107 as shown in FIGS. 11A and 11B. Alternatively, the support tray 301 and the at least one vertical support 307 may be mounted to a different supporting structure, such as the floor of the semiconductor manufacturing facility or to the processing apparatus 110.

The second embodiment positioning apparatus 300 may also include a vertical translation mechanism 303 that enables the support tray 301 to move vertically with respect to the load port 107. In the embodiment shown in FIGS. 11A and 11B, the vertical translation mechanism 303 may move both the support tray 301 and the at least one vertical support 307 vertically with respect to the load port 107. In an alternative embodiment, at least one vertical support 307 may be stationary and the vertical translation mechanism 303 may move the support tray 301 vertically with respect to the load port 107 and the at least one vertical support 307.

The second embodiment positioning apparatus 300 may also include a horizontal positioning mechanism 305 that enables the support tray 301 to move in a horizontal direction, parallel to the direction of arrow hd2, with respect to the load port 107 and the at least one vertical support 307. In embodiments, the support tray 301 may move in a horizontal direction between a first position, in which the support tray 301 is located over an upper surface (e.g., mounting surface 104) of the load port 107 as shown in FIG. 11B, and a second position in which the support tray 301 may be laterally displaced from the load port 107 such that it is not located over the upper surface (e.g., mounting surface 104) of the load port 107 (i.e., as shown in FIGS. 13B, 14B, 15B, 17B, 18B, 22B, 23B, 24B, 25B and 28B). In some embodiments, the horizontal positioning mechanism 305 may move the support tray 301 in a horizontal direction by translating the support tray 301 along a direction that is parallel to the direction of arrow hd2. Alternatively, or in addition, in some embodiments the horizontal positioning mechanism 305 may move the support tray 301 in a horizontal direction by pivoting or rotating the support tray 301 in a plane that is parallel to the direction of arrow hd2.

The vertical translation mechanism 303 and the horizontal positioning mechanism 305 may each include a motor and a linear actuator (e.g., belt drive, lead screw, ball screw, rack and pinion, etc.) that may move the support tray 301 in vertical and horizontal directions, respectively, relative to the load port 107. In various embodiments, the second embodiment positioning apparatus 300 including the support tray 301, the at least one vertical support(s) 307, the vertical translation mechanism 303, and the horizontal positioning mechanism 305, may be coupled to and supported by the load port 107. In various embodiments, the second embodiment positioning apparatus 300 may also be operatively coupled to the load port 107, such that the load port 107 may control the second embodiment positioning apparatus 300 to perform operations related to the loading of wafer storage containers 105 (e.g., first wafer storage container 105A and second wafer storage container 105B) onto the load port 107 and the unloading (i.e., removing) of wafer storage containers 105 from the load port 107.

Referring to FIG. 11C, an exemplary structure of a support tray 301 of the second embodiment positioning apparatus 300 is shown in a top view. The support tray 301 may include a flat surface 309 that surrounds an open region 310 on three-sides. Side walls 308 may optionally extend around three sides of the flat surface 309. The support tray 301 may also include at least one groove or slot 311 through which the at least one vertical support 307 may extend. The support tray 301 may move horizontally in the direction of arrow hd2 with respect to the at least one vertical support 307. The flat surface 309 of the support tray 301 may be slidable beneath a portion of a wafer storage container 105, such as a FOUP. The support tray 301 may then be moved vertically (i.e., into and out of the page in FIG. 11C) to raise and lower the storage container 105, similar to the operation of a forklift or pallet jack. The support tray 301 may also move horizontally with respect to the at least one vertical support 307 to move the wafer storage container 105 horizontally along the direction of arrow hd2 with respect to a load port 107. The open region 310 of the support tray 301 may enable the wafer storage container 105 to be vertically lowered to engage with a mounting surface 104 (e.g., a kinematic plate) of the load port 107 to load the wafer storage container 105 onto the load port 107.

FIGS. 12A-19B are sequential front and side views, respectively, of the second embodiment positioning apparatus 300 shown in FIGS. 11A-11C illustrating an exemplary process for unloading a first wafer storage container 105A from a load port 107 and loading a second wafer storage container 105B on the load port 107 (i.e., an "in-and-out" event) according to an embodiment of the disclosure. Reference is also made again to the flowchart of FIG. 30 illustrating a method 400 of processing semiconductor wafers that includes unloading (i.e., removing) a first wafer storage container 105A from a load port 107 and loading a second wafer storage container 105B on the load port 107 (i.e., an "in-and-out" event) according to an embodiment of the disclosure. Referring to FIGS. 11A-11B, a first wafer storage container 105A is shown located on the load port 107 with the support tray 301 located over the upper surface of the load port 107 and below a portion of the first wafer storage container 105A. Referring to FIGS. 12A and 12B and to step 402 of method 400, the vertical translation mechanism 303 may move the support tray 301 vertically upwards to lift the first wafer storage container 105A off the surface of the load port 107, thereby removing the first wafer storage container 105A from the load port 107. An OHT vehicle 103 is shown carrying a second wafer storage container 105B containing WIPs for processing by a processing apparatus 110 associated with the load port 107. In various embodiments, the first wafer storage container 105A and the second wafer storage container 105B may contain semiconductor wafers 109 for processing by a wafer processing apparatus 110.

In various embodiments, when the processing of the WIPs of the first wafer storage container 105A is complete, the load port 107 may issue a call to the AMHS 100 to retrieve the first wafer storage container 105A from the load port 107 and load a second wafer storage container 105B onto the load port 107. The load port 107 may also direct the vertical translation mechanism 303 to raise the first wafer storage container 105A to the position shown in FIGS. 12A and 12B while the load port 107 awaits the arrival of the OHT vehicle 103 carrying the second wafer storage container 105B. Alternatively, the first wafer storage container 105A may not be raised until the OHT vehicle 103 carrying the second wafer storage container 105B arrives at the load port 107.

FIGS. 13A and 13B are front and side views, respectively, of the second embodiment positioning apparatus 300 showing the support tray 301 and the first wafer storage container 105A moved horizontally with respect to the load port 107. Referring to FIGS. 13A and 13B, and step 404 of method 400, after the first wafer storage container 105A is lifted off the load port 107, the horizontal positioning mechanism 305 may move the support tray 301 with respect to the vertical supports 307. This causes the first wafer storage container 105 to move in a first direction, which may be a horizontal direction (i.e., parallel to the direction of arrow hd2) with respect to the load port 107. The support tray 301 and the first wafer storage container 105A may be laterally displaced from the load port 107 such that the support tray 301 and the first wafer storage container 105A are not located over an upper surface (e.g., mounting surface 104) of the load port 107.

FIGS. 14A and 14B are front and side views, respectively, of the second embodiment positioning apparatus 300 showing the first wafer storage container 105A moved horizontally with respect to the load port 107 while a second wafer storage container 105B may be loaded onto the load port 107 by the hoist mechanism 111 of the OHT vehicle 103. Referring to FIGS. 14A and 14B and step 406 of method 400, because the first wafer storage container 105A may be displaced from the load port 107 along a first direction (i.e., a horizontal direction) by the horizontal movement of the support tray 301, the hoist mechanism 111 of the OHT vehicle 103 may transfer the second wafer storage container 105B, including at least one work-in-progress contained therein, to the load port along a second direction (i.e., a vertical direction) that is perpendicular to the first direction. As shown in FIGS. 14A and 14B, the second wafer storage container 105B may be lowered vertically onto the mounting surface 104 of the load port 107 by the hoist mechanism 111 without being obstructed by the first wafer storage container 105A.

FIGS. 15A and 15B are front and side views, respectively, of the second embodiment positioning apparatus 300 showing the first wafer storage container 105A moved horizontally with respect to the load port 107 and vertically raised above the load port 107 and an upper surface of the second wafer storage container 105B. Referring to FIGS. 15A and 15B, the vertical translation mechanism 303 may translate the support tray 301 and the first wafer storage container 105A vertically upwards until the lower surfaces of the support tray 301 and first wafer storage container 105A may be raised above the height of the upper surface of the second wafer storage container 105B located on the load port 107. In some embodiments, the horizontal translation of the support tray 301 and the first wafer storage container 105A shown in FIGS. 14A and 14B may occur simultaneously with the vertical translation of the support tray 301 and the first wafer storage container 105A such that when the OHT vehicle 103 has finished delivering the second wafer storage container 105B and has retracted the hoist mechanism 111, the apparatus 300 may be in the configuration shown in FIGS. 15A and 15B.

Figure 16B:
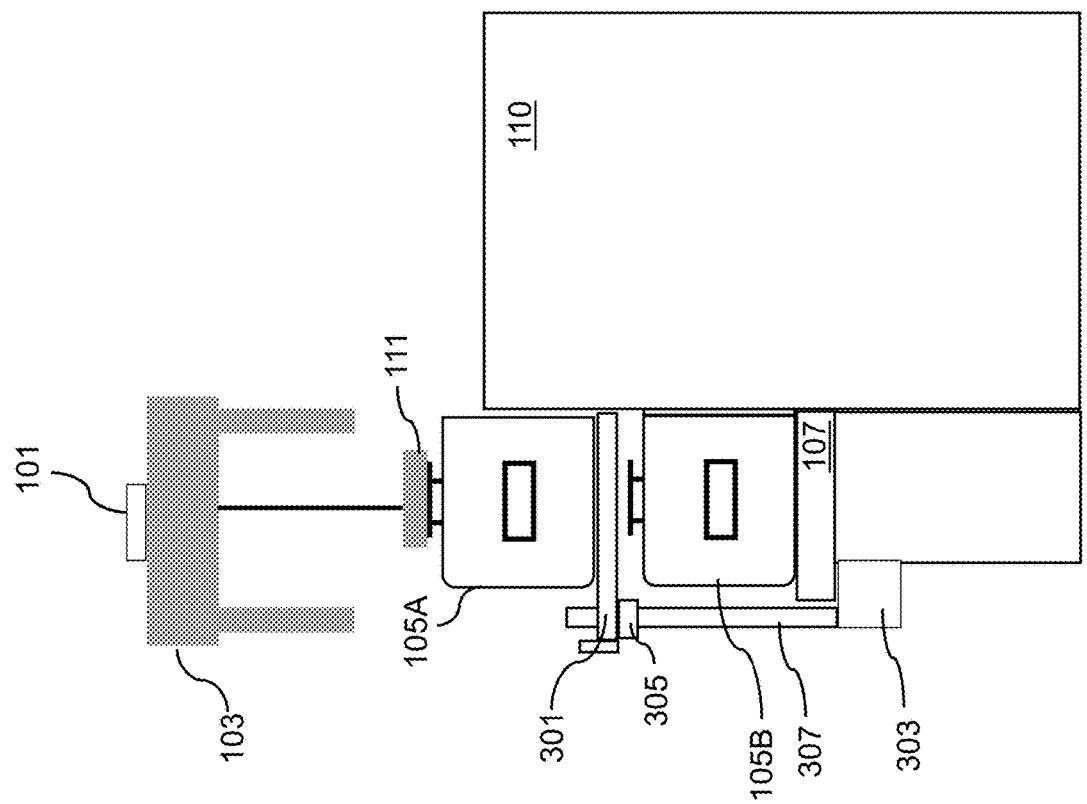
FIGS. 16A and 16B are front and side views, respectively, of the second embodiment positioning apparatus showing the first wafer storage container in a raised position and moved horizontally over an upper surface of the second wafer storage container by a horizontal translation of the support tray.
Figure 16A:
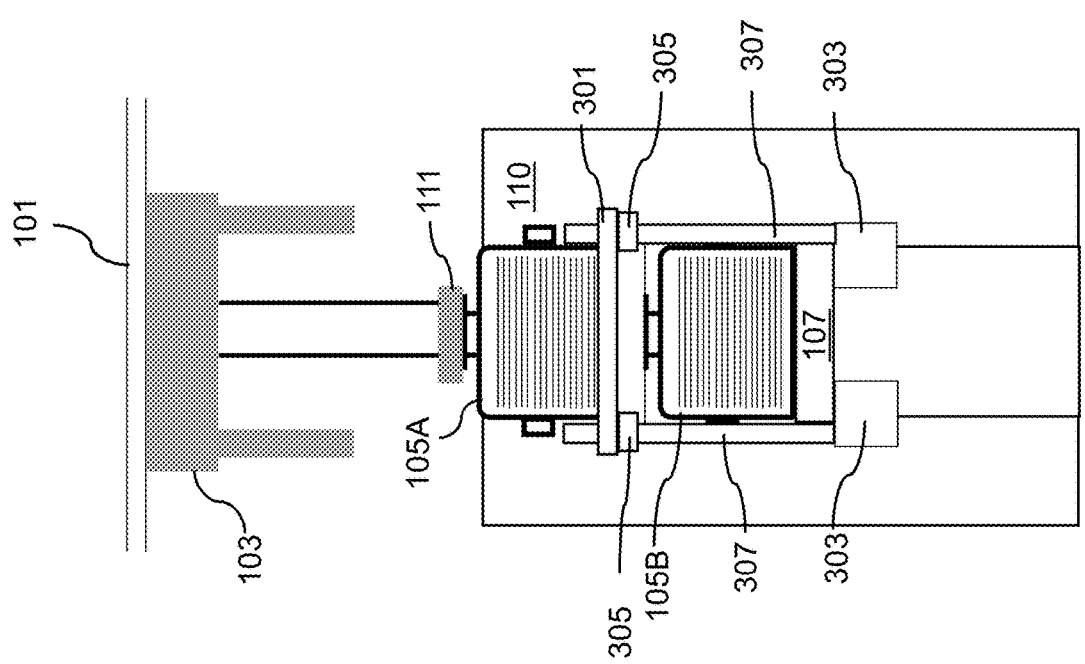

FIGS. 16A and 16B are front and side views, respectively, of the second embodiment positioning apparatus 300 showing the first wafer storage container 105A in a raised position and moved horizontally over an upper surface of the second wafer storage container 105B by a horizontal movement of the support tray 301. Referring to FIGS. 16A and 16B, the horizontal positioning mechanism 305 may move the support tray 301 in a horizontal direction parallel to the direction of arrow hd2 to move the support tray 301 and the first wafer storage container 105A over the upper surface of the second wafer storage container 105B and the load port 107.

Referring again to FIGS. 16A and 16B, an empty OHT vehicle 103 positioned over the load port 107 may lower its hoist mechanism 111 to capture the first wafer storage container 105A for transport of the first wafer storage container 105A to another location in the semiconductor fabrication facility. Referring to FIGS. 16A and 16B and step 406 of method 400, the first wafer storage container 105A, including at least one first work-in-progress contained therein, may be transferred from the support tray 301 to the OHT vehicle 103 along the second (i.e., vertical) direction.

In various embodiments, the empty OHT vehicle 103 that picks up the first wafer storage container 105A from the load port 107 may be the same OHT vehicle 103 that delivered the second wafer storage container 105B to the load port 107. Thus, by utilizing an apparatus 300 according to the second embodiment of the present disclosure, a single OHT vehicle 103 may be used to complete an "in-and-out" event at the load port 107. This may result in a significant time savings and may improve the overall manufacturing efficiency of the fabrication facility.

FIGS. 17A and 17B are front and side views, respectively, of the second embodiment positioning apparatus 300 showing the first wafer storage container 105A located in an OHT vehicle 103 and the support tray 301 moved horizontally with respect to the load port 107. Referring to FIGS. 17A and 17B, the horizontal positioning mechanism 305 may move the support tray 301 in a horizontal direction parallel to the direction of arrow hd2 to laterally displace the support tray 301 from the upper surface of the second wafer storage container 105B and the load port 107.

FIGS. 18A and 18B are front and side views, respectively, of the second embodiment positioning apparatus 300 showing the support tray 301 in a vertically lowered position and laterally displaced from the second wafer storage container 105B and the load port 107. Referring to FIGS. 18A and 18B, the vertical translation mechanism 303 may translate the support tray 301 in vertically downward direction. The support tray 301 may remain laterally displaced from the second wafer storage container 105B so that the second wafer storage container 105B does not obstruct the support tray 301 as it is lowered. The support tray 301 may be lowered to a height that is above the upper surface of the load port 107 and below a portion of the second wafer storage container 105B.

FIGS. 19A and 19B are front and side views, respectively, of the second embodiment positioning apparatus 300 showing the support tray 301 moved horizontally such that the support tray 301 is located above an upper surface of the load port 107 and below a portion of the second wafer storage container 105B. Referring to FIGS. 19A and 19B, the horizontal positioning mechanism 305 may move the support tray 301 in a horizontal direction parallel to the direction of arrow hd2 such that the support tray 301 may slide between the upper surface of the load port 107 and a portion of the second wafer storage container 105B. The second embodiment positioning apparatus 300 may thus return to the configuration shown in FIGS. 11A and 11B (albeit with the second wafer storage container 105B in place of the first wafer storage container 105A). The second embodiment positioning apparatus 300 may then be used to unload the second wafer storage container 105B from the load port 107 and to load an additional wafer storage container 105 (not shown) onto the load port 107 via the process shown and described above with reference to FIGS. 12A-19B.

A second embodiment positioning apparatus 300 according to the present disclosure may provide significant cost savings and efficiency improvements for an AMHS 100. In various embodiments, an AMHS utilizing a second embodiment positioning apparatus 300 to perform "in-and-out" events utilizing a process such as shown in FIGS. 12A-19B may have an average DTA-OUT of about 10 seconds, in comparison to a conventional AMHS system in which the DTA-OUT may average ~55 seconds. In various embodiments, an AMHS utilizing a second embodiment positioning apparatus 300 may have an average DTA-OUT that is at least 50%, such as at least 75%, including more than 80% lower (e.g., 80-90% lower) than the average DTA-OUT of a conventional AMHS. Furthermore, by utilizing a second embodiment positioning apparatus 300 as shown in FIGS. 12A-19B, the transfer efficiency of the AMHS 100 may improve by at least about 20%, including by at least 30%, relative to a conventional AMHS. This may provide significant cost savings, including up to ⅓ of the cost or more for an overhead AMHS.

Figure 31:
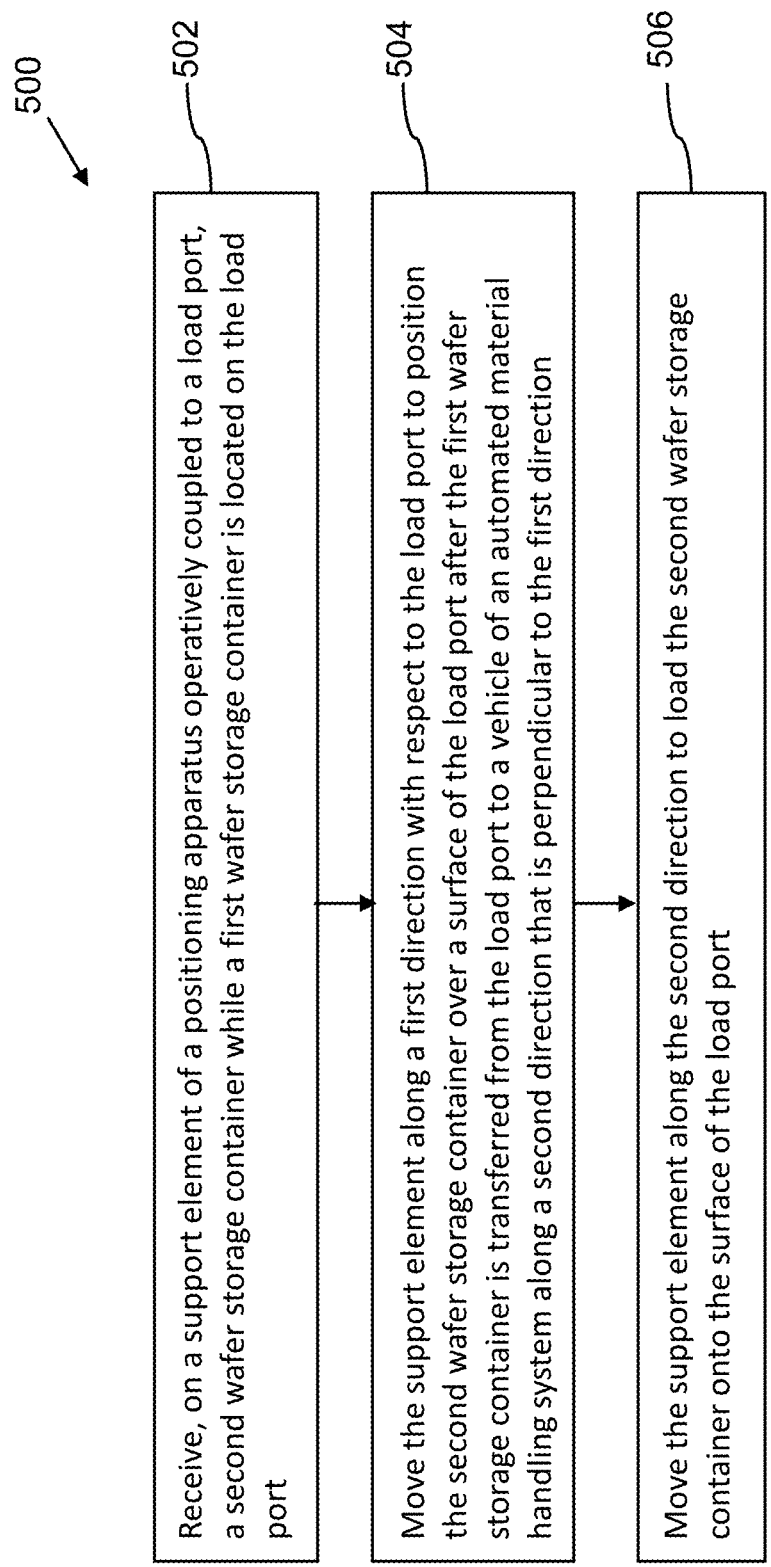
FIG. 31 is a flowchart illustrating a method of processing semiconductor wafers according to another embodiment.

FIGS. 20A-29B are sequential front and side views of the second embodiment positioning apparatus 300 shown in FIGS. 11A-11C illustrating an alternative process for unloading a first wafer storage container 105A from a load port 107 and loading a second wafer storage container 105B on the load port 107 according to an embodiment of the disclosure. FIG. 31 is a flowchart illustrating a method 500 of processing semiconductor wafers that includes receiving, on a positioning apparatus 300, a second wafer storage container 105B from a vehicle 103 of an AMHS 100 while a first wafer storage container 105A is located on a load port 107, and using the positioning apparatus 300 to load the second wafer storage container 105B onto the load port 107 when the first wafer storage container 105A is transferred from the load port 107 to a vehicle 103 of the AMHS 100. Referring to FIGS. 20A-29B, the alternative embodiment process may utilize the support element (e.g., support tray 301) of the second embodiment positioning apparatus 300 as a "buffer" for holding a second wafer storage container 105B containing WIPs (e.g., semiconductor wafers) to be processed while a first wafer storage container 105A may be loaded onto the load port 107 for processing. The alternative embodiment process may further reduce the time required for loading of wafer storage containers 105 at the load port 107 and may also reduce OHT vehicle 103 congestion on the AMHS 100, thus providing increased manufacturing efficiency.

FIGS. 20A and 20B are front and side views, respectively, of the second embodiment positioning apparatus 300 showing a first wafer storage container 105A loaded onto the load port 107 and the support tray 301 located over an upper surface of the first wafer storage container 105A. The first wafer storage container 105A may contain a first group of WIPS (e.g., semiconductor wafers 109A) that are currently undergoing processing operations by the processing apparatus 110 associated with the load port 107. Referring to FIGS. 20A and 20B, an OHT vehicle 103 is shown above the load port 107 carrying a second wafer storage container 105B containing a second group of WIPs (e.g., semiconductor wafers 109B). The second group of WIPs may be ready for processing by the processing apparatus 110.

In embodiments, the AMHS 100 may deliver the second wafer storage container 105B to the load port 107 in response to a request from the load port 107. However, in various embodiments, the load port 107 does not need to wait until processing is finished on the first group of WIPs from the first wafer storage container 105A before requesting delivery of the second wafer storage container 105B by the AMHS 100. In various embodiments, the load port 107 may issue the request for a second wafer storage container 105B at any time during the processing of the WIPs from the first wafer storage container 105A. Further, because the WIPs from the second wafer storage container 105B will typically not need to be processed immediately upon their delivery to the load port 107, the load port 107 may issue the request for the second wafer storage container 105B with a lower priority. Thus, if the AMHS 100 is currently handling a large quantity of requests, such that there is a shortage of available OTS vehicles 103 and/or a large volume of traffic on the overhead track system 101, when the request to deliver the second wafer storage container 105B is received, the AMHS 100 may delay responding to this request until there is less traffic on the overhead track system 101 and/or a sufficient number of OTS vehicles 103 available to carry out the request. However, any such delay may not affect processing time if the WIPs from the first wafer storage container 105A are still being processed when the second wafer storage container 105B may be delivered to the load port 107.

FIGS. 21A and 21B are front and side views, respectively, of the second embodiment positioning apparatus 300 showing the second wafer storage container 105B lowered onto the support tray 301 by the hoist mechanism 111 of the OHT vehicle 103. Referring to FIGS. 21A and 21B and step 502 of method 500, a support element (i.e., support tray 301) of the second embodiment positioning apparatus 300 may receive the second wafer storage container 105B while the first wafer storage container 105A is located on the load port 107. As discussed above, the second wafer storage container 105B may be delivered to the second embodiment positioning apparatus 300 associated with load port 107 at any time while the WIPs from the first wafer storage container 105A are still being processed by the processing apparatus 110. The second embodiment positioning apparatus 300 may utilize the support tray 301 as a "buffer" for the second wafer storage container 105B while the WIPs from the first wafer storage container 105A are being processed. In various embodiments, the OHT vehicle 103 that delivers the second wafer storage container 105B to the support tray 301 may be free to perform other tasks and may not wait for the first wafer storage container 105A to be ready to be picked up.

FIGS. 22A and 22B are front and side views, respectively, of the second embodiment positioning apparatus 300 showing the support tray 301 and the second wafer storage container 105B moved laterally relative to the load port 107 and the first wafer storage container 105A. Referring to FIGS. 22A and 22B, the horizontal positioning mechanism 305 may translate the support tray 301 in a horizontal direction parallel to the direction of arrow hd2 to laterally displace the support tray 301 and the second wafer storage container 105B from the first wafer storage container 105A and the load port 107. In embodiments, the support tray 301 and the second wafer storage container 105B may be moved to the position shown in FIGS. 22A and 22B when the WIPs from the first wafer storage container 105A may be finished processing in order to allow the first wafer storage container 105A to be picked up by an OHT vehicle 103.

FIGS. 23A and 23B are front and side views, respectively, of the second embodiment positioning apparatus 300 showing the first wafer storage container 105A being removed from the load port 107 by the hoist mechanism 111 of an OHT vehicle 103. While the first wafer storage container 105A is being picked up by the OHT vehicle 103, the support tray 301 and the second wafer storage container 105B may remain in the laterally-displaced position of FIGS. 22A and 22B so as not to obstruct the hoist mechanism 111 and the first wafer storage container 105A as the first wafer storage container 105A is unloaded from the load port 107.

FIGS. 24A and 24B are front and side views, respectively, of the second embodiment positioning apparatus 300 showing the first wafer storage container 105A located in the OHT vehicle 103. In various embodiments, the load port 107 may issue a call to the AMHS 100 to send an OHT vehicle 103 to retrieve the first wafer storage container 105A when the processing of the first wafer storage container 105A is completed. However, the load port 107 does not need to request delivery of a new wafer storage container 105 because the second wafer storage container 105B containing ready-for-processing WIPs has already been delivered to the support tray 301.

FIGS. 25A-27B are sequential front and side views of the second embodiment positioning apparatus 300 illustrating the process of loading the second wafer storage container 105B onto the load port 107 according to an embodiment. Referring to FIGS. 25A and 25B, the vertical translation system 303 may translate the support tray 301 in a vertically downward direction to lower the second wafer storage container 105B towards the upper surface of the load port 107. In some embodiments, the vertical translation of the support tray 301 and the second wafer storage container 105B shown in FIGS. 25A and 25B may occur prior to the first wafer storage container 105A being transferred to the OHT vehicle 103 as shown in FIGS. 23A-24B. The support tray 301 may be moved in a vertically downward direction while the support tray 301 and the second wafer storage container 105B are laterally displaced from the first wafer storage container 105A to lower the second wafer storage container 105B such that at least a portion of the second storage container 105B is laterally adjacent to the first wafer storage container 105A located on the load port 107.

Referring to FIGS. 26A and 26B, and step 504 of method 500, after the first wafer storage container 105A is removed from the load port 107 by the OHT vehicle 103, the horizontal positioning system 303 may move the support tray 301 in a first direction (e.g., a horizontal direction parallel to the direction of arrow hd2) to move the second wafer storage container 105B over the upper surface of the load port 107. In some embodiments, the vertical translation of the support tray 301 and the second wafer storage container 105B shown in FIGS. 25A and 25B may occur simultaneously with the horizontal movement of the support tray 301 and the second wafer storage container 105B shown in FIGS. 26A and 26B. Alternatively, the vertical translation and the horizontal movement may occur sequentially, in either order. In the configuration shown in FIGS. 26A and 26B, the support tray 301 may position the second wafer storage container 105B so that the second wafer storage container 105B is aligned over the upper surface (e.g., mounting surface 104) of the load port 107.

FIGS. 27A and 27B are front and side views, respectively, of the second embodiment positioning apparatus 300 showing the support tray lowering the second wafer storage container 105B onto the upper surface of the load port 107. Referring to FIGS. 27A and 27B, and step 506 of method 500, the vertical translation system 303 may translate the support tray 301 in a second direction (i.e., a vertically downward direction), perpendicular to the first direction, to load the second wafer storage container 105B onto the load port 107. In various embodiments, the second wafer storage container 105B may be lowered such that features on the lower surface of the second wafer storage container 105B may engage with corresponding mating features of the upper surface (i.e., the mounting surface 104) of the load port 107. After the second wafer storage container 105B is lowered onto the load port 107, the support tray 301 may be located between the upper surface of the load port 107 and a portion of the second wafer storage container 105B.

FIGS. 28A and 28B are front and side views, respectively, of the second embodiment positioning apparatus 300 showing the support tray 301 moved in vertical and horizontal directions after the second wafer storage container 105B is loaded onto the load port 107. In various embodiments, the horizontal positioning mechanism 305 may move the support tray 301 in a horizontal direction to cause the support tray 301 to slide out from between the upper surface of the load port 107 and the second wafer storage container 105B. Then, the vertical drive mechanism 303 may translate the support tray 301 in a vertically upward direction along the side of second wafer storage container 105B, as shown in FIGS. 28A and 28B. The vertical drive mechanism 303 may continue to translate the support tray 301 in a vertically upward direction until the support tray 301 is at a height that is greater than a height of the upper surface of the second wafer storage container 105B (see FIGS. 29A and 29B) in preparation to receive delivery of a third wafer storage container 105C (not shown) via an OHT vehicle 103.

Figure 29A:
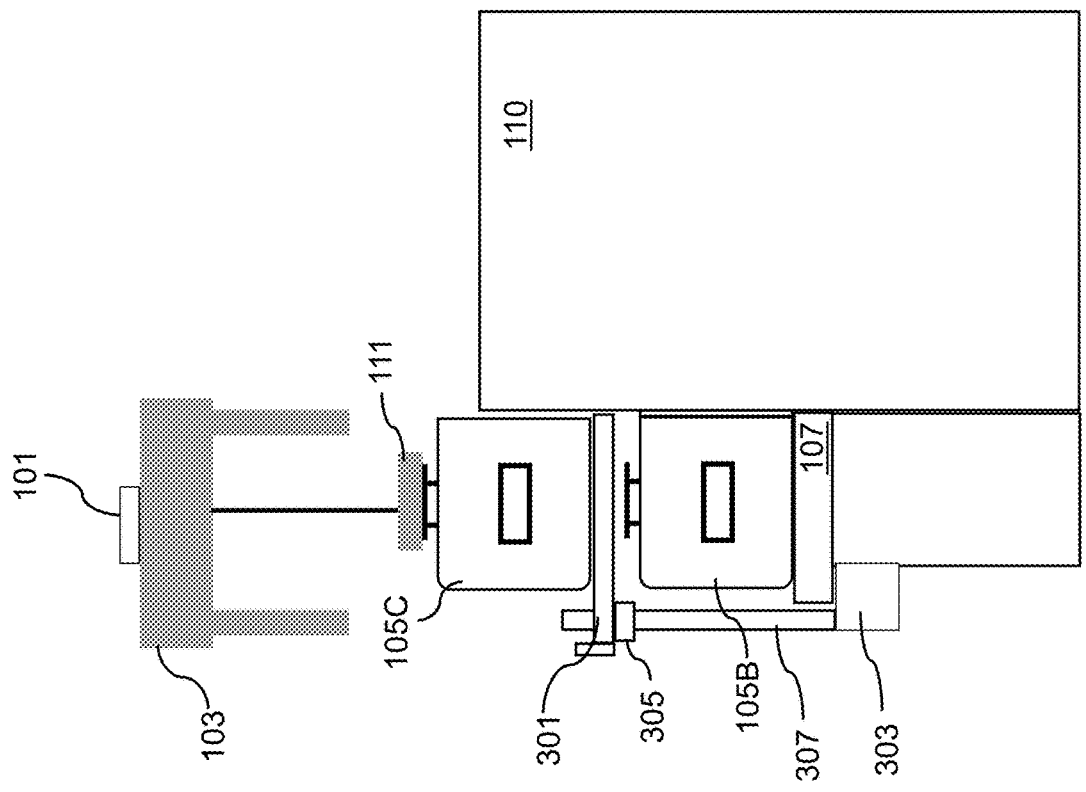
FIGS. 29A and 29B are front and side views, respectively, of the second embodiment positioning apparatus showing the support tray located over an upper surface of the second wafer storage container and a third storage container lowered onto the support tray by an OHT vehicle of the AMHS.
Figure 29B:
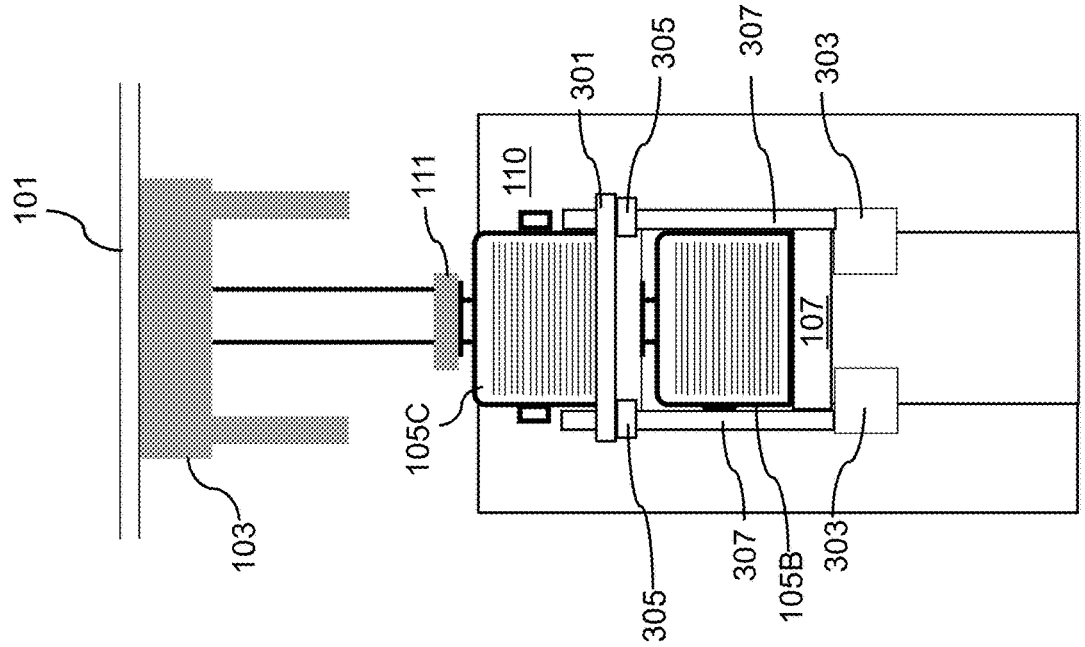

FIGS. 29A and 29B are front and side views, respectively, of the second embodiment positioning apparatus 300 showing the support tray 301 located over an upper surface of the second wafer storage container 105B and a third wafer storage container 105C lowered onto the support tray 301 by the hoist mechanism 111 of the OHT vehicle 103. In embodiments, the vertical drive mechanism 303 and the horizontal positioning mechanism 305 may return the support tray 301 to the position shown in FIGS. 20A and 20B, such that the support tray 301 may be located over the upper surface of the second wafer storage container 105B and the load port 107. An OHT vehicle 103 may then deliver a third wafer storage container 105C onto the support tray 301, as shown in FIGS. 29A and 29B. The second embodiment apparatus 300 may utilize the support tray 301 as a "buffer" for the third wafer storage container 105C while the WIPs from the second wafer storage container 105B are being processed. When the WIPs from the second wafer storage container 105B are finished processing, the second embodiment apparatus 300 may then be used to unload the second wafer storage container 105B from the load port 107 and to load the third wafer storage container 105C onto the load port 107 via the process shown and described above with reference to FIGS. 20A-29B.

As discussed above, the second embodiment positioning apparatus 300 according to the present disclosure may provide significant cost savings and efficiency improvements for an AMHS 100. In particular, an AMHS 100 utilizing a second embodiment apparatus 300 to perform a process as shown in FIGS. 20A-29B and 31 may provide increased efficiency in the loading of storage containers for processing by the processing apparatuses, which may also be referred to as "stocking." The Delivery Time Accuracy-In (DTA-IN) in an AMHS 100 system such as shown and described above may be defined as the time between when the AMHS vehicle, such as an OHT vehicle 103, picks up a storage container 105 containing WIPs intended for processing by a processing apparatus 110, and when the wafer storage container 105 is actually delivered to the load port 107 associated with the processing apparatus 110. In a conventional overhead AMHS 100 system such as shown and described with reference to FIG. 1, the average DTA-IN may be on the order of ~120 seconds. In comparison, an AMHS 100 utilizing the second embodiment positioning apparatus 300 and employing a process such as shown in FIGS. 20A-29B and 31 may have an average DTA-IN that is about 15 seconds. In various embodiments, an AMHS 100 utilizing a second embodiment positioning apparatus 300 may have an average DTA-IN that is at least 60%, such as at least 75%, including more than 80% lower (e.g., 80-90% lower) than the average DTA-IN of a conventional AMHS. Furthermore, by utilizing a second embodiment positioning apparatus 300 and a process as shown in FIGS. 20A-29B and 31, the transfer efficiency of the AMHS 100 may improve by at least about 50%, including by at least 60%, relative to a conventional AMHS. This may provide significant cost savings, including up to ⅓ of the cost or more for an overhead AMHS.

In various embodiments, an AMHS 100 utilizing a second embodiment positioning apparatus 300 may use a process as shown in FIGS. 12A-19B and 30 to improve shipping efficiency and may use a process as shown in FIGS. 20A-29B and 31 to improve stocking efficiency. The AMHS 100 may switch between these processes at some or all of the loading ports 107 of the facility to provide higher prioritization for shipping and for stocking as appropriate.

FIG. 30 is a flowchart illustrating a method 400 of processing semiconductor wafers in accordance with some embodiments. Referring to FIGS. 4A, 4B, 12A, 12B and 30, in step 402 of method 400, a first wafer storage container 105A may be removed from a load port 107 using a positioning apparatus 200, 300 operatively coupled to the load port 107. The first wafer storage container 105A may include semiconductor wafers 109 that have been processed using a wafer processing apparatus 110 associated with the load port 107. Referring to FIGS. 5A, 5B, 13A, 13B and 30, in step 404 of method 400, the first wafer storage container 105A may be moved along a first direction with respect to the load port 107 (e.g., a horizontal direction parallel to the direction of arrow hd2 in FIGS. 5B and 13B) using the positioning apparatus 200, 300 to displace the first wafer storage container 105A from the load port 107. Referring to FIGS. 6A, 6B, 14A, 14B and 30, a second wafer storage container 105B may be transferred from a vehicle (e.g., an OHT vehicle 103) of the AMHS 100 to the load port 107 along a second direction (e.g., a vertical direction) that is perpendicular to the first direction while the first work-in-progress 109 is displaced from the load port 107. Referring to FIGS. 7A, 7B, 8A, 8B, 17A, 17B, 18A-18B and 30, in step 406 of method 400, the first wafer storage container 105A may be transferred from the positioning apparatus 200, 300 to a vehicle 103 of the AMHS 100 along the second direction.

FIG. 31 is a flowchart illustrating a method 500 of processing semiconductor wafers in accordance with another embodiment. Referring to FIGS. 20A, 20B, 21A, 21B and 31, in step 502 of method 500, a second wafer storage container 105B may be received on a support element 301 of a positioning apparatus 300 that is operatively coupled to a load port 107 having a first wafer storage container 105A located on the load port 107. The second wafer storage container 105B may contain semiconductor wafers 109 for processing by a wafer processing apparatus 110 associated with the load port 107. Referring to FIGS. 22A, 22B, 23A, 23B, 24A, 24B, 26A, 26B and 31, in step 504 of method 500, the second wafer storage container 105B may be moved along a first direction with respect to the load port 107 (e.g., a horizontal direction parallel to the direction of arrow hd2 in FIGS. 26B) to position the second wafer storage container 105B over a surface 104 of the load port 107 after the first wafer storage container 105A is transferred from the load port 107 to a vehicle 103 of an automated material handling system 100 along a second direction (i.e., a vertical direction) that is perpendicular to the first direction. Referring to FIGS. 27A, 27B and 31, in step 506 of method 500, the support element 301 may be moved along the second direction (i.e., a vertical direction) to load the second wafer storage container 105B onto the load port 107.

Generally, the structures and methods of the present disclosure may be used to improve the efficiency of an automated material handling system 100 (AMHS), such as an overhead AMHS 100 used in a semiconductor manufacturing facility. An apparatus (200, 300) according to various embodiments may be operatively coupled to a load port 107 of a processing apparatus 110 for processing works-in-progress (WIPs), which may include semiconductor wafers 109 contained in a wafer storage container 105, such as a FOUP. The apparatus (200, 300) may include a support element (203, 301) that is configured to support a WIP, such as by supporting a wafer storage container 105 containing one or more WIPs, above a surface of the load port 107, and is also moveable in two perpendicular directions (e.g., vertically and horizontally) with respect to the load port 107. In one mode of operation, the apparatus (200, 300) may be configured to cause the support element (203, 301) to remove a first WIP from the load port 107, and to move the support element (203, 301) in a first (e.g., horizontal) direction to displace the first WIP from the load port 107 while a second WIP is loaded onto the load port in a second (e.g., vertical) direction by a vehicle 103 of the AMHS 100. The first WIP may then be transferred from the support element (203, 301) to a vehicle 103 of the AMHS 100, which may be the same vehicle 103 that delivers the second group of WIPs. This may significantly reduce the time required to transfer processed WIPs to the AMHS 100 (e.g., DTA-OUT), and may also reduce the event count of the AMHS 100, resulting in improved manufacturing efficiency and lower cost.

In another mode of operation, a vehicle 103 may transfer a WIP to be processed to the support element (203, 301) of the apparatus (200, 300). The support element (203, 301) may function as a "buffer" by holding the WIP to be processed until the WIP that is currently being processed is transferred to a vehicle 103 of the AMHS 100. Then, the apparatus (200, 300) may transfer the WIP to be processed from the support element (203, 301) to the load port 107. This may significantly reduce the time to transfer WIPs to be processed to the load port 107 of the processing apparatus 110 (e.g., DTA-IN), and may also reduce event count of the AMHS 100, resulting in improved manufacturing efficiency and lower cost.

Referring to FIGS. 1-19B and 30, a method of processing semiconductor wafers that may include removing a first wafer storage container 105A from a load port 107 using a positioning apparatus (200, 300) operatively coupled to the load port 107, the first wafer storage container 105A containing semiconductor wafers 109 processed by a wafer processing apparatus 110 associated with the load port 107; moving the first wafer storage container 105A, using the positioning apparatus (200, 300), along a first direction with respect to the load port 107 to displace the first wafer storage container 105A from the load port 107 and enable a second wafer storage container 105B containing semiconductor wafers 109 for processing by the wafer processing apparatus 110 to be transferred from a vehicle 103 of an automated material handling system 100 onto the load port 107 along a second direction that is perpendicular to the first direction; and transferring the first wafer storage container from the positioning apparatus to a vehicle of the automated material handling system along the second direction.

In an embodiment, the vehicle 103 of the automated material handling system 100 that transfers the second wafer storage container 105B to the load port 107 may be the same vehicle 103 to which the first wafer storage container 105A is transferred from the positioning apparatus (200, 300).

In another embodiment, the first direction is a vertical direction and the second direction is a horizontal direction.

In another embodiment, the first wafer storage container 105A may be lifted from a surface 104 of the load port 107 by the positioning apparatus (200, 300) to remove the first wafer storage container 105A from the load port 107.

In another embodiment, the method of processing semiconductor wafers may further include moving the first wafer storage container 105A using the positioning apparatus (200, 300) to position the first wafer storage container 105A over an upper surface of the second wafer storage container 105B on the load port 107 prior to transferring the first wafer storage container 105A to the vehicle 103 of the automated material handling system 100.

In another embodiment, the positioning apparatus (200, 300) may include a support element (203, 301) configured to engage a wafer storage container 105 and support the wafer storage container 105 above a surface of the load port 107, and the method may further include moving the support element (203, 301) of the positioning apparatus (200, 300) to engage with the second wafer storage container 105B located on the load port 107 after the first wafer storage container 105A is transferred to the vehicle 103 of the automated material handling system 100; and removing the second wafer storage container 105B from the load port 107 using the positioning apparatus (200, 300) when the semiconductor wafers of the second wafer storage container 105B have been processed by the wafer processing apparatus 110.

Referring to FIGS. 20A-29B and 31, an additional embodiment is drawn to a method of processing semiconductor wafers that includes receiving, on a support element 301 of a positioning apparatus 300 operatively coupled to a load port 107 associated with a wafer processing apparatus 110, a second wafer storage container 105B containing semiconductor wafers 109 for processing by the wafer processing apparatus 110 while a first wafer storage container 105A may be located on the load port 107; moving the support element 301 using the positioning apparatus 300 along a first direction with respect to the load port 107 to position the second wafer storage container 105B over a surface 104 of the load port 107 after the first wafer storage container 105A may be transferred from the load port 107 to a vehicle 103 of an automated material handling system 100 along a second direction that is perpendicular to the first direction; and moving the support element 301 using the positioning apparatus 300 along the second direction to load the second wafer storage container 105B onto the surface of the load port 107.

In an embodiment, the first direction is a vertical direction and the second direction is a horizontal direction.

In another embodiment, the method may further include moving the support element 301 using the positioning apparatus 300 in a horizontal direction to laterally displace the support element 301 from the surface 104 of the load port 107 and the second wafer storage container 105B located on the surface 104 of the load port 107, and moving the support element 301 using the positioning apparatus 300 into a position to receive a third wafer storage container 105C containing semiconductor wafers 109 for processing by the wafer processing apparatus 110 while the semiconductor wafers 109 of the second wafer storage container 105B are being processed by the wafer processing apparatus 110.

In another embodiment, moving the support element 301 into a position to receive a third wafer storage container 105C may include moving the support element 301 using the positioning apparatus 300 in a vertically upwards direction laterally adjacent to the second wafer storage container 105B located on the load port 107, and moving the support element 301 using the positioning apparatus 300 in a horizontal direction over an upper surface of the second wafer storage container 105B located on the load port 107.

In another embodiment, the method may further include receiving, on the support element 301, a third wafer storage container 105C containing semiconductor wafers 109 for processing by the wafer processing apparatus 110 from a vehicle 103 of the automated material handling system 100, and moving the support element 301 using the positioning apparatus 300 in a horizontal direction to laterally displace the support element 301 and the third wafer storage container 105C from the upper surface of the second wafer storage container 105B.

Referring to FIGS. 1-29B, an additional embodiment is drawn to a positioning apparatus (200, 300) operatively coupled to a load port 107 that is configured to receive a wafer storage container 105 containing semiconductor wafers 109 for processing by a wafer processing apparatus 110, such that the positioning apparatus (200, 300) may include at least one vertical support member (201, 307); a support element (203, 301) coupled to the at least one vertical support member (201, 307) and configured to support a wafer storage container 105 above a surface of the load port 107; a vertical translation mechanism (208, 303) coupled to the support element (203, 301) that is configured to translate the support element (203, 301) in a vertical direction with respect to the load port 107; and a horizontal positioning mechanism (205, 210, 305) coupled to the support element (203, 301) that is configured to move the support element (203, 301) in a horizontal direction with respect to the load port 107.

In an embodiment, the at least one vertical support member may include a pair of support rods 201 and the support element includes a pair of hooks 203 configured to lift the wafer storage container 105 from the load port 107, and each hook 203 is coupled to a respective support rod 201 of the pair of support rods 201.

In another embodiment, the pair of support rods 201 and the pair of hooks 203 may be pivotable with respect to the load port 107, and the horizontal positioning mechanism (205, 210) moves the pair of hooks 203 in a horizontal direction by pivoting the support rods 201 and the hooks 203 with respect to the load port 107.

In another embodiment, the pair of hooks 203 may be configured to lift the wafer storage container 105 by engaging a pair of handles 115 of the wafer storage container 105 as the pair of hooks 203 are translated in a vertically upward direction by the vertical translation mechanism.

In another embodiment, each hook 203 of the pair of hooks 203 may be a retractable hook that retracts as the pair of hooks 203 are translated vertically downward below a height of a pair of handles 115 of the second storage container 105B.

In another embodiment, the support element (301) may include a support tray 301 and the horizontal positioning mechanism 305 moves the support tray 301 in a horizontal direction relative to the at least one vertical support member 307.

In another embodiment, the support tray 301 may include a flat portion 309 that supports a wafer storage container 105, and an open region 310 interior of the flat portion 309 that enables the support tray 301 to lower the wafer storage container 105 onto the load port 107.

In another embodiment, the flat portion 309 of the support tray 301 may be moveable in a horizontal direction between an upper surface of the load port 107 and a lower surface of a wafer storage container 105 that is loaded onto the load port 107.

In another embodiment, the wafer storage container 105 is a front opening unified pod (FOUP).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of processing semiconductor wafers, comprising:
   removing a first wafer storage container from a load port using a positioning apparatus operatively coupled to the load port, the first wafer storage container containing semiconductor wafers processed by a wafer processing apparatus associated with the load port, and the positioning apparatus comprises a support element configured to engage a wafer storage container and support the wafer storage container above a surface of the load port;
   moving the first wafer storage container, using the positioning apparatus, along a first direction with respect to the load port to displace the first wafer storage container from the load port and to enable a second wafer storage container containing semiconductor wafers for processing by the wafer processing apparatus to be transferred from a vehicle of an automated material handling system onto the load port along a second direction that is perpendicular to the first direction;
   transferring the first wafer storage container from the positioning apparatus to a vehicle of the automated material handling system along the second direction;
   after the first wafer storage container is transferred to the vehicle of the automated material handling system, moving the support element of the positioning apparatus to engage with the second wafer storage container located on the load port, wherein the support element of the positioning apparatus comprises a pair of retractable hooks, and the pair of retractable hooks retract as the pair of retractable hooks are translated along the second direction adjacent to a pair of handles of the second wafer storage container located on the load port; and
   removing the second wafer storage container from the load port using the positioning apparatus when the semiconductor wafers of the second wafer storage container have been processed by the wafer processing apparatus.

2. The method of claim 1, wherein the vehicle of the automated material handling system that transfers the second wafer storage container to the load port is the same vehicle to which the first wafer storage container is transferred from the positioning apparatus.

3. The method of claim 1, wherein the first direction is a vertical direction and the second direction is a horizontal direction.

4. The method of claim 3, wherein the first wafer storage container is lifted from a surface of the load port by the positioning apparatus to remove the first wafer storage container from the load port.

5. The method of claim 3, further comprising moving the first wafer storage container using the positioning apparatus to position the first wafer storage container over an upper surface of the second wafer storage container on the load port prior to transferring the first wafer storage container to the vehicle of the automated material handling system.

6. The method of claim 1, wherein the pair of retractable hooks extend after the retractable hooks are translated beyond the pair of handles of the second wafer storage container such that upper surfaces of each of the retractable hooks are located directly beneath a respective handle of the second wafer storage container.

7. A positioning apparatus operatively coupled to a load port that is configured to receive a wafer storage container containing semiconductor wafers for processing by a wafer processing apparatus, the positioning apparatus comprising:
at least one vertical support member;
a support element coupled to the at least one vertical support member and configured to support the wafer storage container above a surface of the load port;
a vertical translation mechanism coupled to the support element that is configured to translate the support element in a vertical direction with respect to the load port; and
a horizontal positioning mechanism coupled to the support element that is configured to move the support element in a horizontal direction with respect to the load port, wherein;
the at least one vertical support member comprises a pair of support rods and the support element comprises a pair of hooks configured to lift the wafer storage container from the load port, and each hook is coupled to a respective support rod of the pair of support rods,
the pair of support rods and the pair of hooks are pivotable with respect to the load port, and the horizontal positioning mechanism moves the pair of hooks in a horizontal direction by pivoting the support rods and the pair of hooks with respect to the load port,
the pair of hooks are configured to lift the wafer storage container by engaging a pair of handles of the wafer storage container as the pair of hooks are translated in a vertically upward direction by the vertical translation mechanism, and
each hook of the pair of hooks is a retractable hook that retracts as the pair of hooks are translated vertically downward below a height of the pair of handles of the wafer storage container located on the load port.

8. The positioning apparatus of claim 7, wherein the wafer storage container is a front opening unified pod (FOUP).

9. The positioning apparatus of claim 7, wherein each hook of the pair of hooks is coupled to a respective support rod by a pivot joint that enables the hook to pivot between an extended position and a retracted position.

10. The positioning apparatus of claim 9, wherein each of the hooks is biased into the extended position by a spring mechanism.

11. The positioning apparatus of claim 10, wherein as the pair of hooks are translated vertically downward a force exerted on the retractable hooks by the handles of the wafer storage container located on the load port is sufficient to cause the retractable hooks to pivot to the retracted position.

12. The positioning apparatus of claim 11, wherein the bias force of the spring mechanism causes the retractable hooks to return to the extended position once the hooks are lowered beneath the handles of the wafer storage container such that upper surfaces of each of the retractable hooks are located directly beneath a respective handle of the wafer storage container.

13. The positioning apparatus of claim 9, further comprising a motorized system configured to pivot each of the hooks between the extended position and the retracted position.

14. A positioning apparatus operatively coupled to a load port that is configured to receive a wafer storage container containing semiconductor wafers for processing by a wafer processing apparatus, the positioning apparatus comprising:
at least one vertical support member;
a support element coupled to the at least one vertical support member and configured to support the wafer storage container above a surface of the load port;
a vertical translation mechanism coupled to the support element that is configured to translate the support element in a vertical direction with respect to the load port; and
a horizontal positioning mechanism coupled to the support element that is configured to move the support element in a horizontal direction with respect to the load port, wherein the support element comprises a support tray and the horizontal positioning mechanism moves the support tray in a horizontal direction relative to the at least one vertical support member, the support tray includes a flat portion that supports the wafer storage container and an open region interior of the flat portion that enables the support tray to lower the wafer storage container onto an upper surface of the load port, and the flat portion of the support tray is moveable in a horizontal direction between the upper surface of the load port and a lower surface of a wafer storage container that is loaded onto the upper surface of the load port.

15. The positioning apparatus of claim 14, wherein the wafer storage container is a front opening unified pod (FOUP).

16. The positioning apparatus of claim 14, wherein the flat portion of the support tray surrounds the open region of the support tray on three sides of the open region.

17. The positioning apparatus of claim 16, wherein the support tray further comprises at least one side wall extending adjacent to the flat portion of the support tray.

18. The positioning apparatus of claim 17, wherein the support tray comprises three side walls extending around three sides of the flat portion of the support tray.

19. The positioning apparatus of claim 14, wherein the support tray comprises at least one groove or slot through which the at least one vertical support member extends.

20. The positioning apparatus of claim 14, wherein the open region of the support tray enables the wafer storage container to be vertically lowered such that a bottom surface of the wafer storage container engages with a mounting surface of the load port to load the wafer storage container onto the load port.

* * * * *